(12) United States Patent
Ohtani et al.

(10) Patent No.: US 6,326,248 B1
(45) Date of Patent: *Dec. 4, 2001

(54) PROCESS FOR FABRICATING SEMICONDUCTOR DEVICE

(75) Inventors: Hisashi Ohtani; Takeshi Fukunaga; Akiharu Miyanaga, all of Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/712,288

(22) Filed: Nov. 15, 2000

Related U.S. Application Data

(62) Division of application No. 09/138,471, filed on Aug. 11, 1998, now Pat. No. 6,184,068, which is a division of application No. 08/456,667, filed on Jun. 1, 1995, now Pat. No. 5,854,096.

(30) Foreign Application Priority Data

Jun. 2, 1994 (JP) .................................................. 6-145575
Jun. 23, 1994 (JP) .................................................. 6-165930

(51) Int. Cl.⁷ ............................. H01L 21/00; H01L 21/84
(52) U.S. Cl. ......................... 438/151; 438/166; 438/402; 438/486; 438/487
(58) Field of Search ................................. 438/151, 166, 438/402, 486, 487, 764

(56) References Cited

U.S. PATENT DOCUMENTS

| | | | |
|---|---|---|---|
| 4,659,392 | 4/1987 | Vasudev | 437/942 |
| 4,814,292 | 3/1989 | Sasaki et al. | 437/247 |
| 5,147,826 | 9/1992 | Liu et al. | 438/486 |
| 5,275,851 | 1/1994 | Fonash et al. | 438/479 |
| 5,278,093 | 1/1994 | Yonehara | 437/173 |
| 5,424,230 | 6/1995 | Wakai | 437/247 |
| 5,529,951 | 6/1996 | Noguchi et al. | 438/487 |
| 5,543,352 | 8/1996 | Ohtani et al. | 437/101 |
| 5,576,222 | 11/1996 | Arai et al. | 438/486 |
| 5,597,741 | 1/1997 | Sakamoto et al. | 438/486 |
| 5,789,284 | 8/1998 | Yamazaki et al. | 438/166 |
| 5,843,833 | 12/1998 | Ohtani et al. | 438/486 |
| 5,854,096 | 12/1998 | Ohtani et al. | 438/166 |
| 5,869,363 | 2/1999 | Yamazaki et al. | 438/166 |
| 5,985,740 | 11/1999 | Yamazaki et al. | 438/486 |
| 5,994,172 | 11/1999 | Ohtani et al. | 438/151 |
| 6,071,766 | 6/2000 | Yamazaki et al. | 438/166 |
| 6,184,068 * | 2/2001 | Ohtani et al. | 438/151 |

OTHER PUBLICATIONS

C. Hayzelden et al., "In Situ Transmission Electron Microscopy Studies of Silicide–Mediated Crystallization of Amorphous Silicon" (3 pages).

A.V. Dvurchenskii et al., "Transport Phenomena in Amorphous Silicon Doped by Ion Implantation of 3d Metals", *Akademikian Lavrentev Prospekt* 13, 630090 Novosibirsk 90, USSR, pp. 635–640.

T. Hempel et al., "Needle–Like Crystallization of Ni Doped Amorphous Silicon Thin Films", *Solid State Communications*, vol. 85, No. 11, pp. 921–924, 1993.

(List continued on next page.)

*Primary Examiner*—Richard Elms
*Assistant Examiner*—Christian D. Wilson
(74) *Attorney, Agent, or Firm*—Eric J. Robinson; Nixon Peabody LLP

(57) ABSTRACT

A process for fabricating a semiconductor device comprising the steps of: introducing into an amorphous silicon film, a metallic element which accelerates the crystallization of the amorphous silicon film; applying heat treatment to the amorphous silicon film to obtain a crystalline silicon film; irradiating a laser beam or an intense light to the crystalline silicon film; and heat treating the crystalline silicon film irradiated with a laser beam or an intense light.

24 Claims, 9 Drawing Sheets

OTHER PUBLICATIONS

"Crystallized Si Films By Low–Temperature Rapid Thermal Annealing of Amorphous Silicon", R. Kakkad, J. Smith, W.S. Lau, SLJ. Fonash, J. Appl. Phys. 65 (5), Mar. 1, 1989, 1989 American Institute of Physics, pp. 2069–2072.

Fuse et al., "Performance of Poly–Si Thin Film Transistors Fabricated by Excimer Laser Annealing of SiH4–and Si2H6–Source Low Pressure Vapor Deposited a–Si Films With or Without Solid–Phase Crystallization", Solid State Phenomena, vols. 37–38, 1994, pp.

"Polycrystalline Silicon Thin Film Transistors on Corning 7059 Glass Substrates Using Short Time, Low Temperature Processing" G. Liu, S.J. Fonash, Appl. Phys. Lett. 62 (20), May 17, 1993, 1993 American Institute of Physics, pp. 2554–2556.

Bonnel et al., "Polycrystalline Silicon Thin–Film Transistors With Two–Step Annealing Process", IEEE Electron Device Letters, vol. 14, No. 12, Dec. 1993, pp. 551–553.

Caune et al., "Combined CW Laser and Furnace Annealing of Amorphous Si and Ge in Contact With Some Metals", Applied Surface Science, vol. 36, 1989, pp. 597–604.

Nam et al., "Thin–Film Transistors With Polycrystalline Silicon Prepared by a New Annealing Method", Japan J. Appl. Phys., vol. 32, 1993, pp. 1908–1912.

"Low Temperature Selective Crystallization of Amorphous Silicon", R. Kakkad, G. Liu, S.J. Fonash, Journal of Non–Crystalline Solids, vol. 115, (1989), pp. 66–68.

"Selective Area Crystallization of Amorphous Silicon Films by Low–Temperature Rapid Thermal Annealing", Gang Liu and S.J. Fonash, Appl. Phys. Lett. 55 (7), Aug. 14, 1989, 1989 American Institute of Physics, pp. 660–662.

* cited by examiner

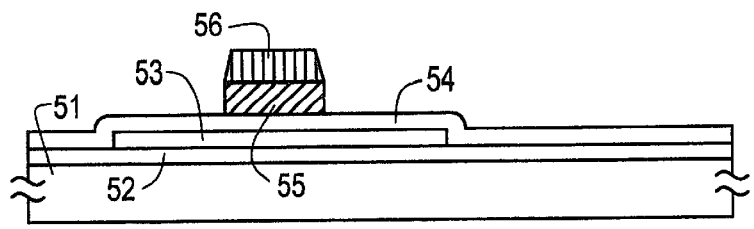
FIG. 6A
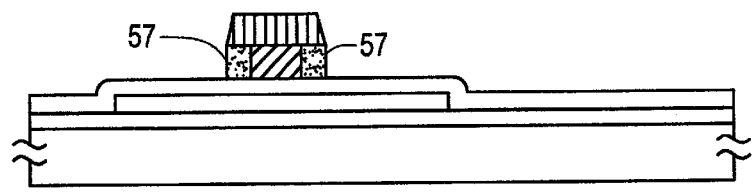
FIG. 6B
FIG. 6C
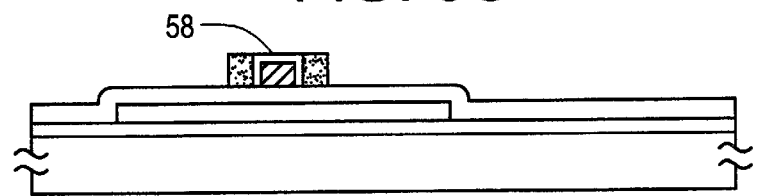
FIG. 6D
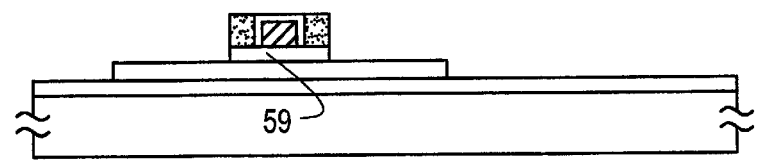
FIG. 6E
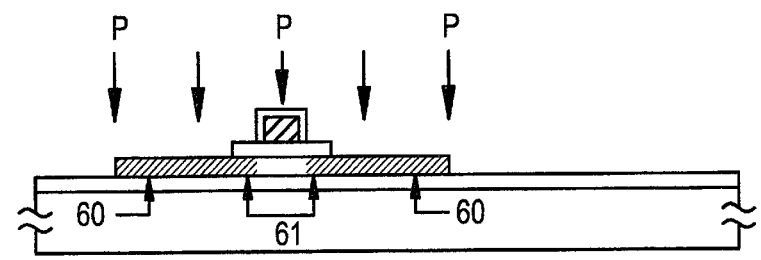
FIG. 6F
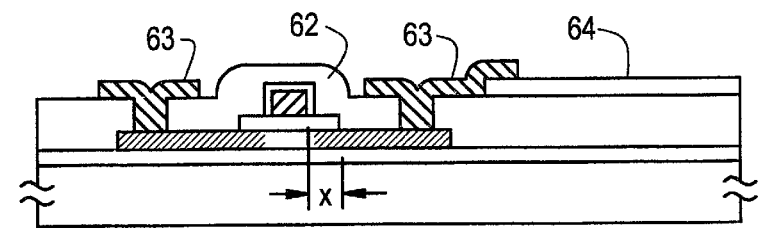

FIG. 8

| No | SAMPLE MANUFACTURE CONDITION | SPIN DENSITY (spins/cm$^3$) | g VALUE |
|---|---|---|---|
| 1 | 560°C, 4h | 3.22 x 10$^{18}$ | 2.0055 |
| 2 | 550°C, 4h | 7.72 x 10$^{18}$ | 2.0055 |
| 3 | (550°C, 4h) + LC | 8.21 x 10$^{18}$ | 2.0057 |
| 4 | (550°C, 4h) + LC + (550°C, 4h) | 7.65 x 10$^{17}$ | 2.0051 |
| 5 | 600°C, 24h | 1.06 x 10$^{18}$ | 2.0052 |
| 6 | 600°C, 24h (WITHOUT Ni) | 3.06 x 10$^{18}$ | 2.0049 |

HEAT TREATMENT AND LASER LIGHT IRRADIATION

IMPURITY ION IMPLANTATION

HEAT TREATMENT STEP

PROCESS FOR FABRICATING SEMICONDUCTOR DEVICE

This application is a Divisional of application Ser. No. 09/138,471 filed Aug. 11, 1998 now U.S. Pat. No 6,184,068; which itself is a Divisional of application Ser. No. 08/456,667 filed Jun. 1, 1995, now U.S. Pat. No. 5,854,096.

BACKGROUND OF THE INVENTION

1. Field of the Invention

The present invention relates to a semiconductor device using crystalline semiconductor, and to a process for fabricating the same.

2. Prior Art

Thin film transistors (hereinafter referred to simply as "TFTs") are well known as devices utilizing thin film semiconductors. The TFTs are fabricated by forming a thin film semiconductor on a substrate and processing the thin film semiconductor thereafter. The TFTs are used in various types of integrated circuits, and are particularly noted in the field of electrooptical devices; especially, they attracted much attention in the field of switching elements that are provided to each of the pixels of active matrix(addressed) liquid crystal display devices and driver elements of the peripheral circuits thereof.

Amorphous silicon film can be utilized most readily as the thin film semiconductors for TFTs. However, the electric characteristics of the amorphous silicon film are disadvantageously poor. The use of a thin film of crystalline silicon can solve the problem. Crystalline silicon films are known as polycrystalline silicon, polysilicon, microcrystalline silicon, etc. The crystalline silicon film can be prepared by first forming an amorphous silicon film, and then heat treating the resulting film for crystallization.

However, the heat treatment for the crystallization of the amorphous silicon film requires heating the film at a temperature of 600° C. or higher for 20 hours or longer. Such a heat treatment has a problem that it is difficult to use a glass as a substrate. For instance, A Corning 7059 glass commonly used for the substrate of active matrix liquid crystal display devices has a glass deformation temperature of 593° C., and is therefore not suitable for using in large area substrates that are subjected to heating at a temperature of 600° C. or higher. That is, if a commonly used Corning 7059 glass substrate is heated at a temperature of 600° C. or higher for 20 hours or longer, distinct shrinking and warping occur on the substrate.

The aforementioned problem can be overcome by performing the heat treatment at a temperature as low as possible. On the other hand, from the viewpoint of increasing productivity, it is required to shorten the duration of this heat treatment step as much as possible.

In case of crystallizing an amorphous silicon film by heating, moreover, the entire film becomes crystalline. Accordingly, it is not possible to crystallize the film locally, or to control the crystallinity of a particular region.

To overcome the aforementioned problems, JP-A-2-140915 and JP-A-2-260524 (the term "JP-A-" as referred herein signifies an "unexamined published Japanese patent application") propose a technique which comprises artificially introducing portions or regions inside an amorphous silicon film to provide sites as the crystallization nuclei, and then heat treating the amorphous silicon film thereafter to crystallize the film selectively. The technology allows crystal nuclei to form at predetermined sites within the amorphous silicon film.

According to the constitution of JP-A-2-140915, for instance, an aluminum layer is formed on the amorphous silicon film, and crystal nuclei are allowed to generate in the portion at which the amorphous silicon is in contact with aluminum. Thus, by heat treating the resulting film, crystal growth is initiated from the thus provided crystal nuclei. JP-A-2-260524 proposes a constitution which comprises adding tin (Sn) into an amorphous silicon film by means of ion implantation, and then generating crystal nuclei from the region into which tin ions are added.

Aluminum (Al) and tin (Sn) are substitutive metallic elements. Thus, they cannot diffuse and intrude deeply into the silicon film because they readily form an alloy with silicon. Accordingly, the alloy serves as the crystal nuclei, and the crystallization in this case proceeds from these alloy portions. The crystallization process using Al or Sn is characterized in that the crystal growth occurs from the portion into which Al or Sn is introduced (i.e., the alloy layer of Si and Al or Sn). In general, crystallization proceeds in two steps; a first step of generating initial nuclei, and a subsequent step of crystal growth which occurs from the initial nucleation sites. The metallic elements of the substitutive type, i.e., Al and Sn, are effective for generating the initial nucleation sites, but have almost no effect on the later step of crystal growth.

Thus, the temperature of crystallization cannot be lowered or the duration of crystallization be shortened by using Al or Sn. That is, the method using Al or Sn is none the better as compared with the conventional crystallization of simply heating the amorphous silicon film.

According to the study of the present inventors, it is possible to crystallize an amorphous silicon film by heating the film at 550° C. for about 4 hours. This can be accomplished by first depositing a trace amount of an intrusion type element, such as nickel or palladium, on the surface of the amorphous silicon film, and heating the resulting product thereafter. The intrusion type metallic elements not only facilitates the initial nucleation, but also accelerates the later crystal growth. Thus, as compared with a conventional process which comprises simply heating the film, the heating temperature can be lowered, and the duration of heating can be shortened.

The elements above (i.e., catalyst elements which accelerate the crystallization) can be introduced into the amorphous silicon film in a trace quantity by means of plasma treatment, vapor deposition, or ion implantation. Plasma treatment as referred herein signifies adding the catalyst elements into the amorphous silicon film by effecting the treatment in a plasma CVD apparatus of a parallel plate type or a positive column type by using a material containing the catalyst element as the electrode, and allowing a plasma to generate under, for instance, gaseous nitrogen or gaseous hydrogen.

Metallic elements which accelerate the crystallization above are the intrusive elements such as Fe, Co, Ni, Ru, Rh, Pd, Os, Ir, Pt, Cu, Ag, and Au. These intrusive elements diffuse into the silicon film during the heat treatment step. The crystallization proceeds with progressive diffusion of these intrusive elements. That is, the intrusive elements accelerate the crystallization of the amorphous silicon film by exerting catalytic function at every site they proceed inside the amorphous silicon film.

Thus, by incorporating the intrusive elements to the amorphous silicon film, crystallization can be accelerated in a manner differing from that which proceeds gradually from the crystal nuclei. For instance, if an intrusive element is introduced into a particular portion of an amorphous silicon film and is subjected to heat treatment thereafter, crystallization proceeds from the site the metallic element was introduced, and in a direction parallel to the surface of the film. The length of the thus crystallized region amounts to several tens of micrometers or even longer. Furthermore, by introducing the metallic element above to the entire surface of the film, the film can be wholly and yet uniformly crystallized. As a matter of course, the entire film exhibits a polycrystalline or a microcrystalline structure, but the grain boundary thereof is not distinguished. Accordingly, a device heaving stability in characteristics can be obtained by using a desired portion of the film.

The intrusive elements above rapidly diffuse into the silicon film. Accordingly, the key of this method is the estimation of the quantity to be introduced (added). If the elements are introduced insufficiently, the addition of the elements results in a small effect. A film with favorable crystallinity cannot be expected in such a case. If the elements are introduced in an excessive quantity, on the other hand, the semiconductive characteristics of silicon would be impaired.

Accordingly, the optimum quantity of the intrusive metallic elements above must be estimated. For instance, Ni effectively accelerates the crystallization if it is added into the crystallized silicon film at a concentration of $1 \times 10^{11}$ cm$^{-1}$ or higher. So long as the concentration of nickel does not exceed $1 \times 10^{11}$ cm$^{-1}$, the semiconductive characteristics of the silicon film remains without being impaired. The concentration of the elements in this case is defined as the minimum value obtainable by SIMS (secondary ion mass spectroscopy).

The above description applies not only to nickel, but also to the metallic elements other than nickel enumerated above. Thus, the same effect is expected on the other metallic elements so long as they are added at a concentration in a range defined above.

To control the concentration of the metallic elements above (those metallic elements capable of accelerating crystallization are referred to hereinafter as "catalyst elements") inclusive of nickel in an optimum range for accelerating crystallization, the quantity thereof must be controlled at the point of their introduction.

Considering a case of using nickel as the catalyst element, an amorphous silicon film was deposited, and nickel was added therein by plasma treatment to fabricate a crystalline silicon film. The progress of crystallization and the like was studied in detail. The following points were found as a result:

(1) In case nickel is introduced into the amorphous silicon film by means of plasma treatment, nickel has already been intruded into the amorphous silicon film to a considerable depth before subjecting the film to heat treatment;

(2) Initial crystal nucleation occurs from the surface at which nickel was introduced; and (3) In case of depositing nickel on an amorphous silicon film by evaporation, crystallization occurs in a manner similar to that occurred in plasma treatment.

It can be found from the above findings that not all nickel introduced by plasma treatment function sufficiently effective. That is, even if nickel is introduced in a large quantity, it does not follow that all the nickel atoms function sufficiently. It is therefore assumed that the point (or plane) at which nickel contacts silicon functions to decrease the temperature of crystallization. Conclusively, nickel atoms are preferably dispersed as finely as possible in the amorphous silicon film. In other words, "nickel atoms need to be introduced in the vicinity of the surface of amorphous silicon film at a minimum concentration necessary for realizing the low temperature crystallization of the amorphous silicon film".

Vapor deposition can be mentioned as a method for introducing nickel atoms in a trace amount in only the vicinity of the surface of the amorphous silicon film, i.e., introducing catalyst elements capable of accelerating the crystallization in a trace amount in only the vicinity of the surface of the amorphous silicon film. However, vapor deposition is inferior concerning its controllability, and it fails to precisely control the quantity of catalyst element to be introduced in the amorphous silicon film.

Furthermore, it is required to minimize the quantity of the catalyst element to a level as low as possible. However, there is still a problem that the crystallinity becomes an impurity.

SUMMARY OF THE INVENTION

In the light of the aforementioned circumstances, an object of the present invention is to provide a process for fabricating a thin film of crystalline silicon semiconductor by performing heat treatment at 600° C. or lower and using a catalyst element, yet characterized in that:

(1) the catalyst elements are introduced at a minimum and controlled amount;

(2) the process yields high productivity; and (3) the product thus obtained exhibits a higher crystallinity as compared with the prior art silicon semiconductors fabricated by heat treatment.

The above object of the present invention can be achieved by a process for fabricating a crystalline silicon described below.

That is, the process comprises: maintaining in contact with an amorphous silicon film, a compound containing an element of a catalyst which accelerates the crystallization of amorphous silicon or a compound containing the same; crystallizing the amorphous silicon film either partly or wholly, by applying heat treatment to the amorphous silicon film while maintaining the catalyst element or the compound containing the same into contact with the film; and further accelerating the crystallization by irradiating a laser beam or an intense light equivalent thereto.

In this manner, a crystalline silicon film having an extremely high crystallinity can be obtained.

The catalyst element for accelerating the crystrallization can be introduced most effectively by coating the surface of the amorphous silicon film with a solution containing the catalyst element.

Particularly in the present invention, the catalyst element must be introduced to the amorphous silicon film by bringing the elements into contact with the surface of the amorphous silicon film. This is the key in controlling the quantity of the catalyst to be introduced into the film.

The catalyst element may be introduced either on the upper surface or the lower surface of the amorphous silicon film. In case of introducing the catalyst element in the upper surface of the amorphous silicon film, a solution containing the catalyst element may be applied to the surface of the amorphous silicon film. In case of introducing the catalyst elements into the lower surface of the amorphous silicon film, the solution may be applied to the surface of the base film before depositing the amorphous silicon film, so that the catalyst element may be maintained on the surface of the base film.

The present invention is characterized in that it provides a semiconductor device having an active region containing at least one electrical junction such as a PN, PI, or NI by using the crystallized crystalline silicon film. The semiconductor device according to the present invention include a thin film transistor (TFT), a diode, an optical sensor, etc. Furthermore, a resistor or a capacitor can be formed by using the present invention.

The constitution of the present invention is basically advantageous in the following points:

(a) the concentration of the catalyst element in the solution can be precisely controlled in advance, enabling a crystalline silicon with higher crystallinity and less catalyst element;

(b) the amount of catalyst element to be introduced into amorphous silicon can be controlled in accordance with the concentration of the catalyst element in the solution so long as the surface of the amorphous silicon film be in contact with the solution;

(c) the catalyst element can be introduced at a minimum possible concentration, because the catalyst element adsorbed by the surface of the amorphous silicon film principally contributes to the crystallization; and (d) a crystalline silicon film with favorable crystallinity can be obtained without using a high temperature process.

The solution containing an element which accelerates the crystallization of an amorphous silicon film can be applied in the form of, for example, an aqueous solution or a solution of an organic solvent. The term "solution" as referred herein signifies a solution containing the element in the form of a compound, or a solvent in which the catalyst element is simply dispersed.

A polar solvent such as water, an alcohol, an acid, or ammonia can be used as the solvent for use in the present invention.

In case of using nickel as the catalyst and adding nickel into the polar solvent, nickel is introduced in the form of a compound. More specifically, it may be selected from a group of representative nickel compounds, i.e., nickel bromide, nickel acetate, nickel oxalate, nickel carbonate, nickel chloride, nickel iodide, nickel nitrate, nickel sulfate, nickel formate, nickel acetylacetonate, nickel 4-cyclohexylbutyrate, nickel oxide, and nickel hydroxide.

Otherwise, a non-polar solvent can be used in the solution containing the catalyst element. For example, a solvent selected from benzene, toluene, xylene, carbon tetrachloride, chloroform, ether, trichloroethylene, and Fleon can be used as well.

In this case, nickel is introduced in the solvent in the form of nickel compound. Representative compounds to be mentioned include nickel acetylacetonate and nickel 2-ethylhexanoate.

It is also useful to add a surface active agent into the solution containing the catalyst element. The surfactant increases the adhesion strength of the solution and controls the adsorptivity. The surfactant may be applied previously to the surface of the substrate onto which the amorphous silicon is deposited.

In case nickel simple substance is used as the catalyst element, it may be dissolved into an acid to provide a solution.

The description above is for a case nickel is dissolved completely in a solution. Nickel need not be completely dissolved in a solution, and other materials, such as an emulsion comprising nickel simple substance or a nickel compound in the form of a powder dispersed in a dispersant may be used as well. It is also possible to use a solution designed for forming an oxide film. Specifically mentioned as the solution is OCD (Ohka Diffusion Source) manufactured by Tokyo Ohka Kogyo Co., Ltd. A silicon oxide film can be easily obtained by applying OCD solution to the desired surface, and baking it at about 200° C. An impurity can be freely added into the solution. Accordingly, OCD can be utilized in the process of the present invention. In such a case, the catalyst element is added into the oxide film, and the oxide film is then provided in contact with the amorphous silicon film. Then, the catalyst element can be diffused in the amorphous silicon film by heating the oxide film in a temperature range of from 350 to 400° C. The resulting amorphous silicon film is then subjected to heat treatment for crystallization after the oxide film is removed. The heat treatment for the crystallization is effected in a temperature range of from 450 to 600° C., for instance, at 550° C. for about 4 hours.

The same as those mentioned in the foregoing is applied to the case in which a catalytic element other than nickel is used.

In case an aqueous solution containing a polar solvent such as water and nickel as the catalyst element for accelerating the crystallization of the amorphous silicon film is used, the aqueous solution is sometimes repelled by the amorphous silicon film if it were to be applied directly. This can be prevented from occurring by first forming a thin oxide film 100 Å or less in thickness on the surface of the amorphous silicon film, and then uniformly applying the solution containing the catalyst element to the surface of the resulting oxide film. Otherwise, the wettability of the amorphous silicon film can be improved by adding a surfactant and the like to the solution.

A toluene solution containing nickel 2-ethylhexanoate using the non-polar solvent can be directly applied to the surface of the amorphous silicon film. It is also effective to previously add an adhesive commonly used in coating a resist. However, the solution applied in an excessive amount reversely interferes the intrusion of the catalyst elements into the amorphous silicon film. Thus, the application of the solution to the surface of the amorphous silicon film must be performed with great care.

The amount of the catalyst element to be contained in the solution depends on the kind of the solution, however, roughly speaking, the amount of nickel by weight is from 1 to 200 ppm, and preferably, from 1 to 50 ppm. The concentration is determined based on the nickel concentration or the resistance against hydrofluoric acid of the film upon completion of the crystallization.

The crystallinity of the silicon film crystallized by heat-treatment can be further improved by irradiating a laser beam after the heat treatment. In case crystallization is partially effected by heat treatment, crystals can be grown from the heat-treated portion by irradiating a laser beam to obtain a state further improved in crystallinity.

A laser operated in pulsed mode can be used for the annealing above. For instance, useful lasers include excimer lasers such as a KrF laser emitting light at a wavelength of 248 nm, and XeCl laser (308 nm in wavelength), an XeF laser (351 nm or 353 nm in wavelength), an ArF laser (193 nm in wavelength), or a XeF laser (483 nm in wavelength). furthermore, the lasers may be of a discharge excitation type, an X-ray excitation type, a light excitation type, a microwave excitation type, an electron beam excitation type, etc. The laser is preferably operated in long pulses with intervals in a range of from 10 to 100 $\mu$s. By thus increasing the pulse interval, the silicon film can be kept molten for a longer duration to result in a silicon film improved in crystallinity.

In case the catalyst element is introduced in a small quantity, for instance, the crystallization occurs in minute spot-like regions. When viewed as a whole, this state can be regarded as a state in which crystalline components are mixed with amorphous components. By irradiating a laser beam to such a state, crystals can be allowed to grow from crystal nuclei present in the crystalline components. Thus, a silicon film improved in crystallinity can be obtained. In other words, small crystal grains can be grown into coarser crystals. Accordingly, the improvement in crystallinity by the irradiation of a laser beam becomes particularly distinct in case of an incompletely crystallized silicon film.

Otherwise, an intense light, particularly an infrared rays, can be irradiated in the place of a laser beam. Infrared rays is hardly absorbed by glass, but is readily absorbed by a thin film silicon. Accordingly, thin film silicon can be heated selectively without heating the glass substrate. This process of irradiating the infrared light for a short period of time is known as rapid thermal annealing (RTA) or rapid thermal process (RTP).

In the process according to the present invention, heat treatment is effected after accelerating the crystallization by irradiating a laser beam. The heat treatment can be performed under the same conditions as those employed in crystallizing the amorphous silicon film. As a matter of course, the heat treatment conditions need not be exactly the same as those employed in the previous heat treatment so long as it is effected at a temperature of 400° C. or higher.

By thus performing heat treatment after irradiating a laser beam or an intense light, the defects in the crystalline silicon film can be considerably reduced. FIG. 8 shows the results obtained by electron spin resonance spectroscopy (ESR), i.e., the spin density of a crystalline silicon film fabricated under the conditions described in the conditions of sample preparation. The temperature and the duration of heat treatment are shown in the sample preparation conditions. In the conditions, LC represents the irradiation of a laser beam. All samples, except for the one denoted as "containing no Ni", are crystallized using nickel as the catalyst element. The "g value" is an index representing the position of the spectrum, and a g value of 2.0055 corresponds to a spectrum attributed to a dangling bond. Thus, the spin density shown in FIG. 8 can be interpreted as such corresponding to the dangling bonds that are present in the film.

Referring to FIG. 8, the spin density is lowest for sample 4. This signifies that sample 4 has least dangling bonds, i.e., least defects and density of states. By comparing sample 3 with sample 4, for instance, it can be seen that the spin density is higher for sample 3 by one digit. It can be understood therefrom that the defects and density of states inside a crystalline silicon film can be lowered by one digit or more by adding a step of heat treatment after laser irradiation.

By further comparing sample 2 with sample 3 in FIG. 8, no considerable change occurs in spin density by irradiating a laser beam. That is, the irradiation of a laser beam has almost no effect in reducing the defects in the film. However, according to the analyses based on transmission electron micrphotographs and the like, the irradiation of a laser beam is extremely effective for accelerating the crystallization. Accordingly, it can be understood that the crystallinity of a crystalline silicon film once crystallized by heating can be enhanced most effectively by irradiating a laser beam, an that the application of a heat treatment again to the film whose crystallinity had been improved is particularly effective for reducing the defects within the film. In this manner, a silicon film having a high crystallinity an a low density of defects can be obtained.

In the process according to the present invention, crystal growth can be allowed to occur selectively by applying a solution containing a catalyst element to selected portions of the film. Particularly in case the solution is applied selectively, crystal growth proceeds from the solution-coated region towards the region having no solution coated thereto in a direction approximately parallel to the surface of the silicon film. The direction approximately in parallel with the surface of the silicon film is referred to hereinafter as "a region of lateral crystal growth".

This region of lateral crystal growth is confirmed to contain catalyst elements at a low concentration. It is advantageous to use a crystalline silicon film for the active region of a semiconductor device, however, in general, the active layer region preferably contain impurities at a concentration as low as possible. In this context, the use of this region of lateral crystal growth, is particularly preferred for forming the active region of a semiconductor device.

In the present invention, particularly distinct effect is expected in case nickel is used as the catalyst element. Other useful catalyst elements are, preferably, Fe, Co, Ni, Ru, Rh, Pd, Os, Ir, Pt, Cu, Ag, and Au.

Also useful are the elements In, Sn, P, As, and Sb.

Furthermore applicable are the elements belonging to the Groups VIII, IIIb, IVb, and Vb of the periodic table.

The catalyst elements can be introduced not only by using a solution based on, for instance, an aqueous solution or an alcohol, but widely using a substance containing the catalyst element. For instance, a metallic compound or an oxide containing the catalyst element can be used as well.

To further increase the degree of crystallization, the step of irradiating a laser beam or an intense light can be effected repeatedly for at least twice by taking turns with the step of heat treatment for decreasing the defects within the film.

By using an element of an intrusive type that accelerates crystallization, an amorphous silicon film can be crystallized at a low temperature, and yet, rapidly. More specifically, the crystallization of an amorphous silicon film can be accomplished, for the first time, by heating the film at a temperature as low as 550° C. and in a duration as short as about 4 hours. Furthermore, because an intrusive element accelerates the crystallization by diffusing itself within the silicon film. Accordingly, a crystalline silicon film having no distinct grain boundaries can be obtained unlike from those obtained by crystal growth from crystal nuclei.

By furthermore irradiating a laser beam or an intense light to the crystalline silicon film obtained by crystallization through heating with a catalyst element incorporated therein, a highly crystalline silicon film reduced in the concentration of defects can be obtained.

The defects that are present in the film cannot be reduced by irradiating a laser beam. Moreover, a laser beam irradiated to the surface of a silicon film brings about instantaneously a molten state as to generate a stress inside the film. The stress newly induces a defect. Accordingly, by applying heat treatment to the film, the stress can be relaxed to reduce the defects, and thereby a crystalline silicon film having excellent electrical characteristics can be obtained.

BRIEF DESCRIPTION OF THE DRAWINGS

FIGS. 6(A) to 6(F) are diagrams showing the steps of the fabrication process according to another embodiment of the present invention;

FIG. 8 is a diagram showing the results obtained by ESR; and

DETAILED DESCRIPTION OF THE PREFERRED EMBODIMENTS

Figure 1A:
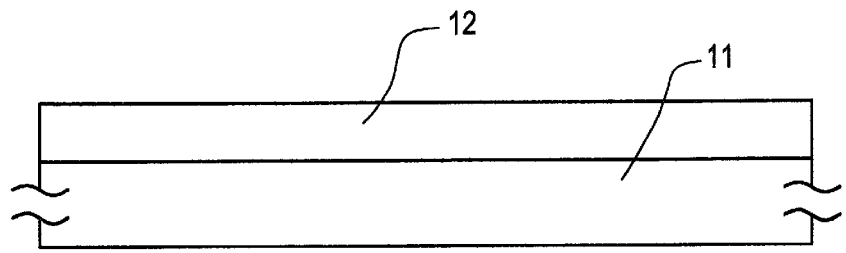
FIGS. 1(A) to 1(D) are diagrams showing the steps of the process according to an embodiment of the present invention.
Figure 1B:
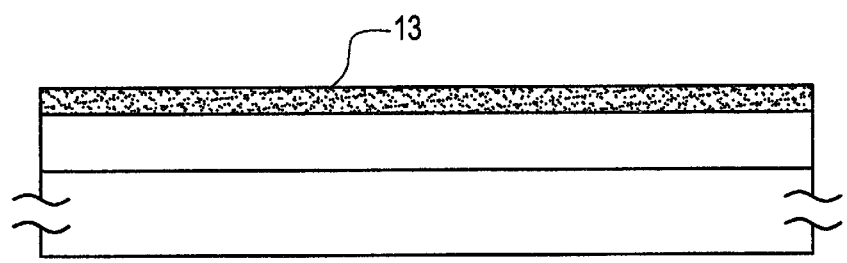
Figure 1C:
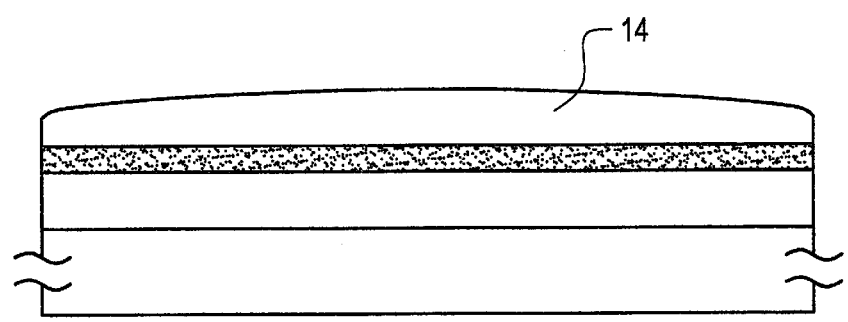
Figure 1D:
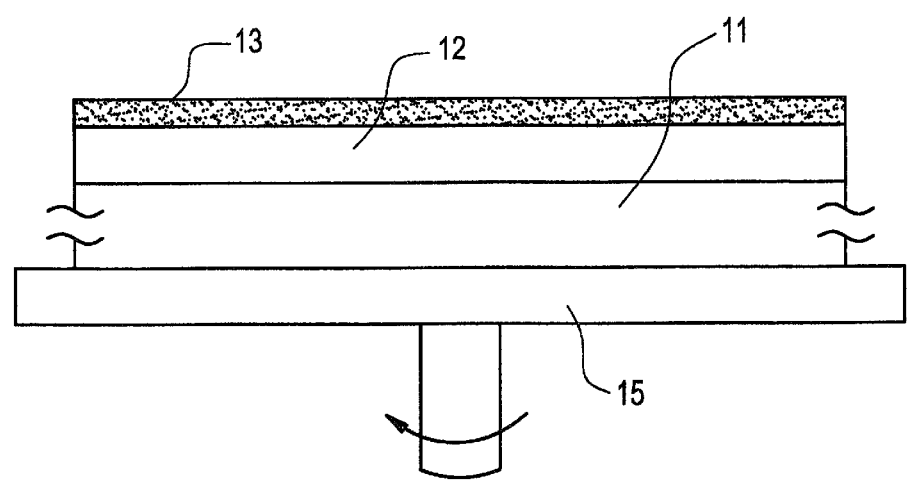

The present invention is described in further detail below referring to the preferred embodiments according to the present invention. It should be understood, however, that the present invention is not to be construed as being limited to the examples below.

EXAMPLE 1

The present example refers to a process which comprises coating an amorphous silicon film with an aqueous solution containing a catalyst element for accelerating the crystallization of the film, an then irradiating a laser beam to increase the crystallinity of the crystallized film.

Referring to FIGS. 1(A) to 1(D), the process for introducing a catalyst element (nickel in this case) into the amorphous silicon film is described below. A Corning 7059 glass substrate having 100 mm×100 mm in size is used.

First, an amorphous silicon film of from 100 to 1,500 Å in thickness is deposited by plasma CVD or LPCVD. More specifically in this case, an amorphous silicon film 12 is deposited by plasma CVD at a thickness of 1,000 Å (FIG. 1(A))

The resulting structure is subjected to a treatment using hydrofluoric acid to remove stains and natural oxide film, and an oxide film 13 is deposited thereafter to a thickness in a range of from 10 to 50 Å. In case stains are negligible, the natural oxide film can be used as it is in the place of the oxide film 13.

Because natural oxide film 13 is extremely thin, the exact thickness thereof is unknown. However, it is assumed to be about 20 Å. In this case, the oxide film 13 is deposited by irradiating a UV light under an oxygen atmosphere for 5 minutes. The oxide film 13 can be formed otherwise by thermal oxidation. Furthermore, a method using hydrogen peroxide can be used as well.

The oxide film 13 is provided with an aim to spread the acetate solution containing nickel, which is to be applied in the later step, on the entire surface of the amorphous silicon film. More briefly, the oxide film is provided for improving the wettability of the amorphous silicon film. If the aqueous acetate solution were to be applied directly, for instance, the amorphous silicon film would repel the aqueous acetate solution to prevent nickel from being incorporated uniformly into the surface of the amorphous silicon film. Still more briefly, it would be impossible to realize a uniform crystallization.

Then, an acetate solution containing 25 ppm of nickel is prepared, and 2 ml of it is dropped to the surface of the oxide film 13 provided on the amorphous silicon film 12. After retaining the state for 5 minutes, spin-drying is effected at a rate of 2,000 rpm for 60 seconds by a spinner (FIGS. 1(C) and 1(D)).

The practical concentration of nickel in the acetate solution is 1 ppm or more, and preferably, 10 ppm or more. In case of using a solution of a non-polar solvent such as a toluene solution of nickel 2-ethylhexanoate, the oxide film 13 need not be formed, and the catalyst element can be directly incorporated into the amorphous silicon film.

This step of applying the nickel solution is repeated more than one time, and more specifically, it is repeated for a several times. In this manner, a nickel-containing layer having a thickness in a range of from several to several hundreds in angstroms (Å) can be obtained on the exposed surface of the amorphous silicon film 12 after spin drying. In this case, nickel in the layer functions as a catalyst which diffuses into the amorphous silicon film and accelerates the crystallization in the later step of heat treatment. This catalyst layer need not be in the form of a complete film.

After applying the solution to the surface of the amorphous film, the resulting structure is retained for 1 minute. The final concentration of nickel to be incorporated into the silicon film 12 can be controlled, however, the principal controlling factor is the concentration of the solution.

The silicon film coated with the nickel-containing solution thus obtained is subjected to heat treatment at a temperature of 550° C. for 4 hours in a gaseous nitrogen of a heating furnance. Thus is obtained a thin film of crystalline silicon 12 on the surface of the substrate 11.

The heat treatment above can be effected at any temperature not lower than 450° C. However, a heat treatment effected at a low temperature yields a low production efficiency because it requires a long duration to complete the treatment. If the heat treatment were to be effected at a temperature of 550° C. or higher, on the other hand, the problem of heat resistance of the glass substrate that is used as the substrate of the structure becomes apparent.

The present example describes a method of introducing the catalyst element on the amorphous silicon film, however, another method which comprises introducing the catalyst element under the amorphous silicon film can be employed. In such a case, the solution containing the catalyst element is applied onto the surface of the base film before depositing the amorphous silicon film.

The crystallinity of the silicon film 12 is further improved by irradiating a laser beam using a KrF excimer laser operated at a wavelength of 248 nm and a pulse width of 30 nsec. The laser is operated to provide several shots per site at an energy density of from 200 to 350 mJ/cm$^2$ in gaseous nitrogen. The laser for use in the annealing need not always be a KrF excimer laser, and an infrared rays can be irradiated otherwise as described hereinbefore. It is also effective to increase the pulse width of the excimer laser light. More specifically, it is particularly effective to set the pulse width in a range of from 10 to 100 μs. By thus increasing the duration of melting the surface of silicon film by irradiating a laser beam, the crystal growth can be accelerated in minute portions.

By thus irradiating a laser beam, the crystallinity of the silicon film can be further improved. More specifically, the crystallization degree can be increased. Upon the completion of the laser beam, heat treatment is effected at a temperature of 550° C. for 4 hours in a gaseous nitrogen.

The heat treatment may be conducted at a temperature of 400° C. or higher. The heat treatment effected after laser irradiation greatly reduces the defects in the silicon film. A crystalline silicon film having excellent crystallinity and containing less defects at the same time can be obtained in this manner.

EXAMPLE 2

The present example refers to a fabrication process according to Example 1, which comprises fabricating a 1,200 Å thick silicon oxide film, and then introducing nickel selectively by using the silicon oxide film as a mask.

Figure 2A:
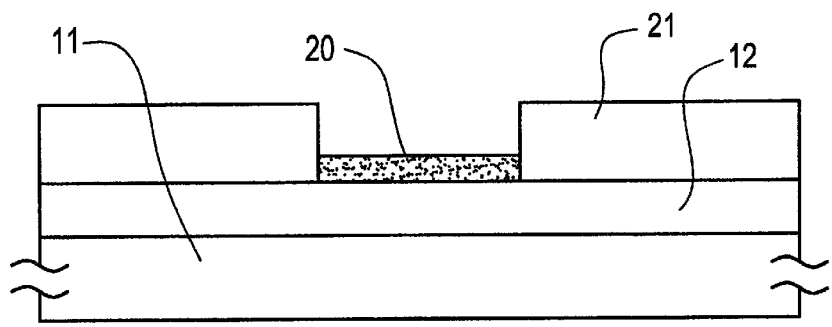
FIGS. 2(A) to 2(C) are diagrams showing the steps of the process according to another embodiment of the present invention.
Figure 2B:
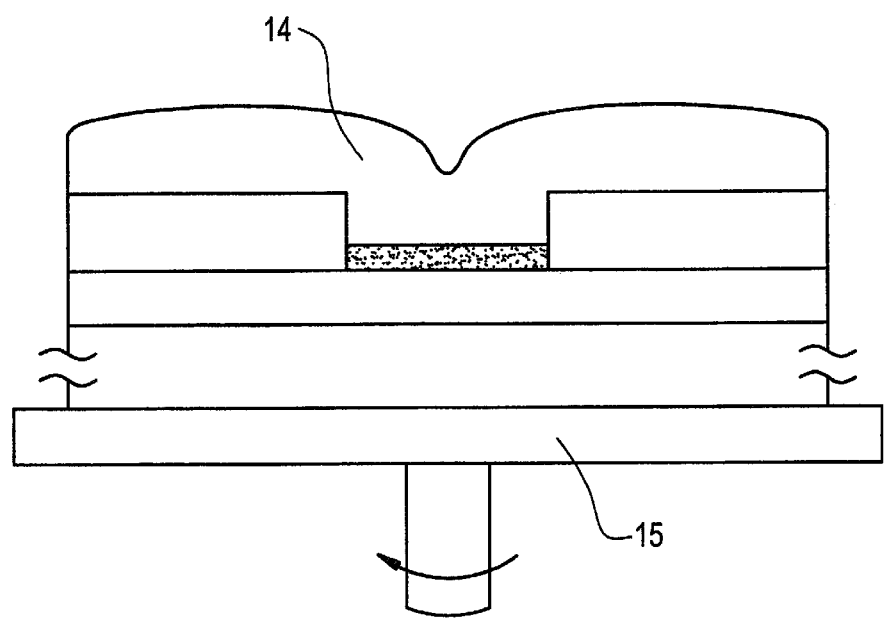
Figure 2C:
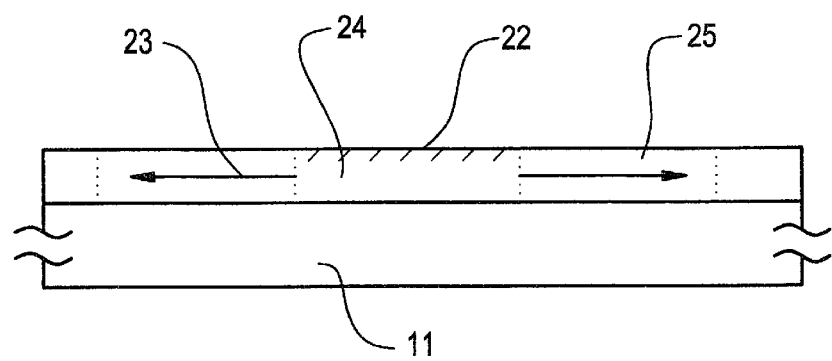

Referring to FIGS. 2(A) to 2(C), the process for fabricating a semiconductor device according to the present example is described below. A silicon oxide film 21 which functions as a mask is deposited of a thickness of 1,000 Å or more, more specifically in this case, at a thickness of 1,200 Å, on a Corning 7059 glass substrate (10 cm×10 cm in size). Considering the thickness of the silicon oxide film 21, however, it is found by the experiments of the present inventors that a film deposited at a thickness of 500 Å can be used without any problem so long as the film is deposited densely. A further thinner film can be used from this point of view.

The silicon oxide film 21 is then patterned into a desired pattern by means of an ordinary photolithography. By irradiating ultraviolet (UV) rays in gaseous oxygen thereafter, a thin silicon oxide film 20 can be obtained. The silicon oxide film 20 is thus fabricated by irradiating UV rays for 5 minutes in gaseous oxygen. The thickness of the silicon oxide film 20 is believed to be in a range of from 20 to 50 Å (FIG. 2(A)). The silicon oxide film is provided here for improving wettability, however, there are some cases in which nickel can be added into the amorphous silicon film by hydrophilic nature of the silicon oxide film provided as the mask. However, such cases are rare, and in general, it is preferable to form the silicon oxide film 20 to improve the process.

Then, in the same manner as in Example 1, 5 ml (with respect to a substrate 10 cm×10 cm in area) of an acetate solution containing 100 ppm of nickel is dropped to the thinly oxidized surface of the amorphous silicon film. Simultaneously with the addition of the acetate solution, spin-coating is effected at a rate of 50 rpm for 10 seconds to form a uniform aqueous film on the entire surface of the substrate. After further retaining this state for 5 minutes, spin-drying is effected for 60 seconds at a rate of 2,000 rpm using a spinner. The retention can be effected by rotating the spinner at a rate in a range of from 0 to 150 rpm (FIG. 2(B)).

The amorphous silicon film 12 is crystallized by performing heat treatment at a temperature of 550° C. for 4 hours in gaseous nitrogen. The crystal growth is found to occur in a lateral direction 23 from the portion 22 into which nickel had been introduced to the region into which nickel was not introduced. Referring to FIG. 2(C), nickel is directly introduced into a region 24, and crystallization proceeded in the lateral direction to provide a crystallized region 25. In the region 25, it is found that the crystal growth occurs approximately in the direction of the <111> axis. It is also confirmed by TEM photograph (transmission electron microphotograph) that in the region 25, columnar or branched crystals grow in a direction parallel to the substrate.

The crystallinity of the silicon film 12 is further improved after the heat treatment for the crystallization by irradiating a laser beam using an XeCl excimer laser operated at a wavelength of 308 nm. The crystallization in this step proceeds between the columnar or branched crystals grown in parallel with the substrate. Thus, the degree of crystallization can be increased. The crystallinity of the region 25 grown in the lateral direction can be greatly improved in this step.

It is also effective to heat the substrate or the surface to which the laser beam is irradiated during the step of laser irradiation. The substrate is preferably heated in a temperature range of from 200 to 450° C.

The defects in the film is then reduced by subjecting the resulting structure to heat treatment at 550° C. in gaseous nitrogen for 4 hours.

In the present example, the nickel concentration in the portion into which nickel is directly introduced can be controlled in a range of from $1\times10^{15}$ to $1\times10^{15}$ atoms·cm$^{-3}$ by varying the concentration of the solution and the time of retention. Similarly, the concentration in the laterally grown region can be controlled to a level lower than the range above.

The crystalline silicon film obtained by the process according to the present example is characterized in that it has excellent resistance against hydrofluoric acid. To the knowledge of the present inventors, the crystalline silicon films crystallized by introducing nickel using plasma treatment yields low resistance against hydrofluoric acid.

For instance, there are cases in which silicon oxide films are formed on a crystalline silicon film to provide a gate insulating film or a interlayer dielectric, and electrodes are formed after perforation. In such cases, the silicon oxide film is removed by using a buffered hydrofluoric acid. However, it is found very difficult to remove the silicon oxide film alone if the crystalline silicon film has inferior resistance against hydrofluoric acid, because the crystalline silicon film would be removed at the same time.

If the crystalline silicon film has sufficiently high resistance against hydrofluoric acid, a large selectivity ratio (difference is etching rate) between the silicon oxide film and the crystalline silicon film can be used advantageously to selectively remove silicon oxide film alone. Accordingly, the fabrication process can be considerably facilitated.

As described in the foregoing, the region of lateral crystal growth contains catalyst elements at a low concentration and yields an excellent crystallinity. Accordingly, this region can be used advantageously as an active region of a semiconductor device; it is found particularly useful when used as a channel forming region of a thin film transistor.

EXAMPLE 3

The present invention relates to a process for fabricating a TFT by using a crystalline silicon film obtained by the process according to the present invention. The TFTs according to the present example can be used in driver circuits or pixel portions of an active matrix-addressed liquid crystal display device. Needless to say, the TFTs thus obtained can be applied not only to liquid crystal display devices, but also to a wide field generally denoted as thin film integrated circuits (ICs).

Referring to FIGS. 3(A) to 3(E), the process for fabricating a TFT according to the present example is described below. A silicon oxide film (not shown) is deposited to a thickness of 2,000 Å as a base film on a glass substrate. This silicon oxide film is provided to prevent the diffusion of impurities into the device structure from the glass substrate.

An amorphous silicon film is deposited thereafter to a thickness of 500 Å in a manner similar to that used in Example 1. After removing the natural oxide film by a treatment using hydrofluoric acid, a thin oxide film is formed to a thickness of about 20 Å by irradiating UV rays under a gaseous oxygen atmosphere. The thin oxide film can be provided otherwise by using hydrogen peroxide or by thermal treatment.

The resulting amorphous silicon film with an oxide film thereof is coated thereafter with an aqueous acetate solution containing nickel at a concentration of 10 ppm. The resulting structure is retained for a 5 minutes, and is subjected thereafter to spin drying using a spinner. The silicon oxide films 20 and 21 are removed thereafter using a buffered hydrofluoric acid, and a silicon film is crystallized by heating the resulting structure at 350° C. for 4 hours. (The process up to this step is the same as that described in Example 1.)

Thus is obtained a silicon film in which crystalline components are mixed with amorphous components. By irradiating a laser beam to such a state by operating KrF excimer laser in a range of from 200 to 300 mJ, the crystallinity of the film can be further improved. During the irradiation of the laser beam, the substrate is heated at a temperature of about 400° C. Thus, in the present step, crystals are allowed to grow from crystal nuclei that exists in the crystalline components.

The silicon film thus crystallized is patterned to form an island-like region 104. The island-like region 104 provides the active layer for the TFT. A silicon oxide film is formed thereafter for a thickness of from 200 to 1,500 Å. Thus, a silicon oxide film 105 is deposited at a thickness of 1,000 Å in this case. The silicon oxide film also functions as a gate insulating film (FIG. 3(A)).

The silicon oxide film 105 must be fabricated with great care. More specifically, the silicon oxide film is deposited by means of RF plasma CVD process using TEOS (tetraethoxysilane) as the starting material. Thus, TEOS is decomposed and then deposited together with oxygen at a substrate temperature of from 150 to 600° C., preferably in the range of from 300 to 450° C. TEOS and oxygen are introduced at a pressure ratio of 1:1 to 1:3 under a total pressure of from 0.05 to 0.5 Torr, while applying an RF power of from 100 to 250 W. Otherwise, the silicon oxide film can be fabricated by reduced pressure CVD or normal pressure CVD using TEOS as the starting gas together with gaseous ozone, while maintaining the substrate temperature in the range of from 350 to 600° C., preferably in the range of from 400 to 550° C. The film thus deposited is annealed in oxygen or ozone in the temperature range of from 400 to 600° C. for from 30 to 60 minutes.

The crystallization of the silicon region 104 can be accelerated by irradiating a laser beam using a KrF excimer laser (operating at a wavelength of 248 nm at a pulse width of 20 nsec) or an intense light equivalent thereto. The application of RTA (rapid thermal annealing) using infrared rays is particularly effective because the silicon film can be heated selectively without heating the glass substrate. Moreover, RTA is especially useful in the fabrication of insulated gate field effect semiconductor devices because it decreases the boundary density of states between the silicon layer and the silicon oxide film.

Upon completion of the irradiation of the laser beam above, the resulting structure is subjected to heat treatment in gaseous nitrogen at 550° C. for a 4 hours.

Subsequently, an aluminum film is deposited to a thickness of from 2,000 Å to 1 μm by electron beam vapor deposition, and is patterned to form a gate electrode 106.

The aluminum film may contain from 0.15 to 0.2% by weight of scandium as a dopant. The substrate is then immersed into an ethylene glycol solution controlled to a pH of about 7 and containing from 1 to 3% of tartaric acid to effect anodic oxidation using platinum as the cathode and the aluminum gate electrode as the anode. The anodic oxidation is effected by first increasing the voltage to 220 V at a constant rate, and then holding the voltage at 220 V for 1 hour to complete the oxidation. In case a constant current is applied as in the present case, the voltage is preferably increased at a rate of from 2 to 5 V/minute. An anodic oxide 109 is formed at a thickness of from 1,500 to 3,500 Å, more specifically, at a thickness of, for example, 2,000 Å in this manner (FIG. 3(B)).

Impurity ions (specifically in this case, phosphorus ions) are implanted into the island-like silicon film of the TFT in a self-aligned manner by ion doping (plasma doping) using the gate electrode portion as a mask. Phosphine ($PH_3$) is used as the doping gas to implant phosphorus at a dose of from $1 \times 10^{15}$ to $4 \times 10^{15}$ $cm^{-2}$.

Figure 3A:
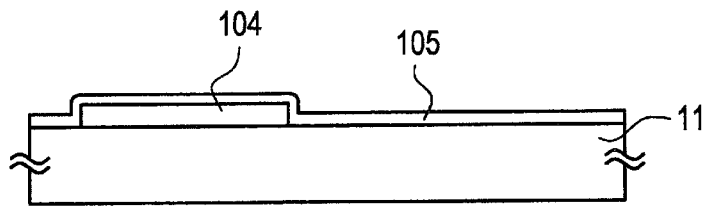
FIGS. 3(A) to 3(E) are diagrams showing the steps of the fabrication process according to another embodiment of the present invention.
Figure 3B:
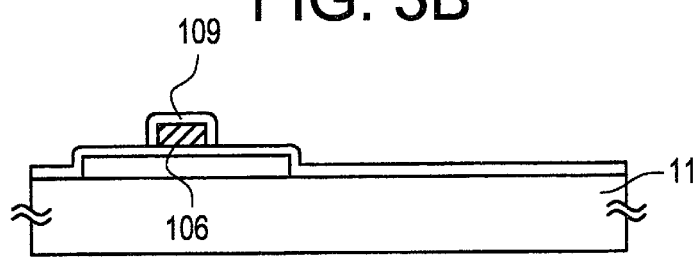
Figure 3C:
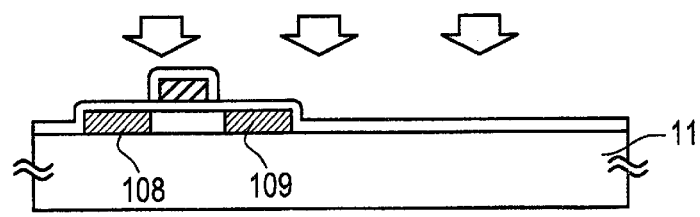
Figure 3D:
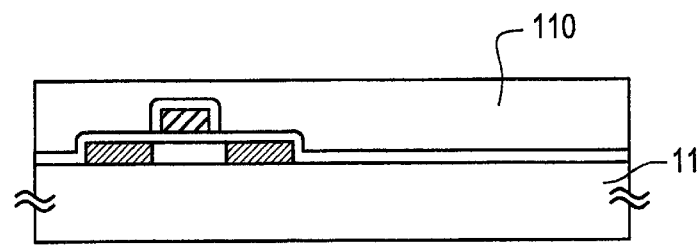
Figure 3E:
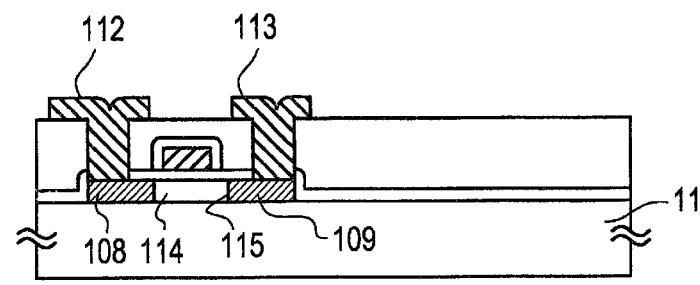

Referring to FIG. 3(C), the crystallinity of the portion whose crystallinity has been impaired by the incorporation of impurities is recovered by irradiating a laser beam using a KrF excimer laser operated at a wavelength of 248 nm and a pulse width of 20 nsec. The laser is operated at an energy density of from 150 to 400 $mJ/cm^2$, preferably, in a range of from 200 to 250 $mJ/cm^2$. Thus are formed N-type impurity regions (regions doped with phosphorus) 108 and 109. The sheet resistance of the regions is found to be in the range of from 200 to 800 $\Omega/\square$.

This step of laser annealing can be replaced by any processes using an intense light equivalent to a laser beam, for instance, an RTA process; i.e., a rapid thermal annealing process using a flash lamp, which comprises elevating the temperature of the silicon film rapidly to a range of from 1,000 to 1,200° C. (as measured on the silicon monitor). This method of annealing is also called as RTP (rapid thermal process).

A silicon oxide film is deposited thereafter to a thickness of 3,000 Å over the entire surface as an interlayer dielectric 110 by means of plasma CVD using TEOS together with oxygen, or by means of reduced pressure CVD or normal pressure CVD using TEOS together with ozone. The substrate temperature is maintained in the range of from 250 to 450° C., for instance, at 350° C. A smooth surface is obtained thereafter by mechanically polishing the resulting silicon oxide film (FIG. 3 (D)).

The interlayer dielectric 110 is etched to form contact holes in the source/drain as shown in FIG. 1(E), and interconnections 112 and 113 are formed using chromium or titanium nitride.

The conventional crystalline silicon films containing nickel incorporated by plasma treatment were apt to be etched during the step of forming contact holes due to the low selectivity of the silicon film to buffered hydrofluoric acid as compared with the selectivity of the silicon oxide film.

However, in the process according to the present invention, nickel is incorporated into the silicon film by using an aqueous solution containing nickel at such a low concentration of 10 ppm. Accordingly, a silicon film having a high resistance against hydrofluoric acid can be realized and contact holes can be formed stably and with high reproducibility.

A complete TFT can be implemented by finally annealing the silicon film in hydrogen in a temperature range of from 300 to 400° C. for from 0.1 to 2 hours to accomplish the hydrogenation of the silicon film. A plurality of TFTs similar to the one described hereinbefore are fabricated simultaneously, and are arranged in a matrix to implement an active matrix liquid crystal display device. The TFTs thus fabricated comprises source/drain regions 108/109 and a channel region 114. An electrical junction NI 115 is also provided.

The TFT fabricated according to the constitution of the present invention assumably comprises an active layer containing nickel at a concentration of about $3\times10^{18}$ atoms·cm$^{-3}$ or lower, more specifically, in a range of from $1\times10^{18}$ to $3\times10^{18}$ atoms·cm$^{-3}$.

The TFT fabricated according to the present invention yields an N-channel mobility of 150 cm$^2$/Vs or higher. It is also confirmed that it yields a low and favorable $V_{th}$ value. The fluctuation in mobility falls within ±10%. The fluctuation in such a narrow range results from the two-step crystallization comprising heat treatment which allows the crystallization to occur incompletely and laser irradiation which further improves the degree of crystallization. Although it is possible to obtain an N-channel mobility of 150 cm$^2$/Vs or higher by using laser irradiation alone for the crystallization, a uniform mobility as such achieved in the present example cannot be obtained, because the fluctuation in value remains too large.

EXAMPLE 4

The present example relates to a case for fabricating an electronic device by selectively introducing nickel according to the process described in Example 2, and by using the region composed of crystals grown in the lateral direction (i.e., in a direction in parallel with the substrate) from the nickel-doped portions. By using the constitution of the present example, the nickel concentration of the active region of the device can be further lowered to advantageously increase the electric stability and the stability of the device.

Referring to FIGS. 4(A) to 4(F), the process for fabricating an electronic device according to an embodiment of the present invention is described below. A substrate 201 is cleaned at first, and a 2,000 Å thick silicon oxide film 202 is deposited thereon as a base film. The film deposition is conducted by plasma CVD using TEOS (tetraethoxysilane) and oxygen as the starting gaseous materials. An intrinsic (I-type) amorphous silicon film 203 is deposited thereafter on the clean substrate by plasma CVD to a thickness of from 500 to 1,500 Å, specifically for example, to a thickness of 1,000 Å. Then, a silicon oxide film 205 is deposited continuously thereafter by plasma CVD to a thickness of from 500 to 2,000 Å, for example, to a thickness of 1,000 Å. An exposed region 206 of amorphous silicon is formed thereafter by selectively etching the silicon oxide film 205.

A solution (specifically, an acetate solution in this case) containing nickel as the catalyst element for accelerating the crystallization is applied according to the process described in Example 2. The process steps and conditions are the same as those of Example 2, except that the applied solution contains nickel at a concentration of 100 ppm. This process may otherwise be carried out according to the process described in Example 3 or 4.

Figure 4A:
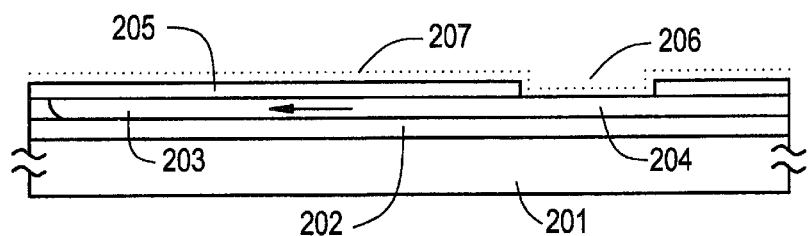
FIGS. 4(A) to 4(F) are diagrams showing the steps of the fabrication process according to another embodiment of the present invention.
Figure 4B:
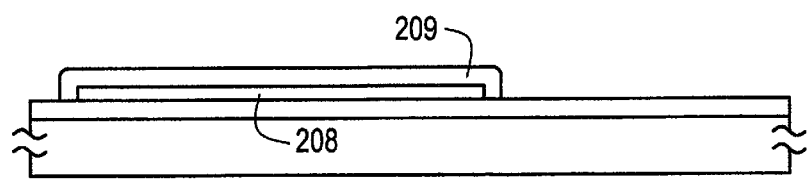
Figure 4C:
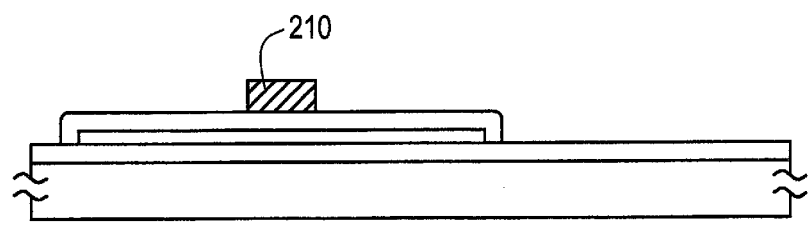
Figure 4D:
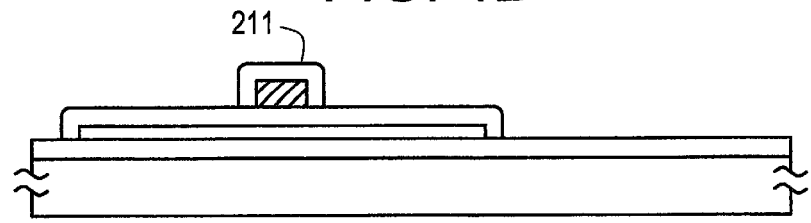
Figure 4E:
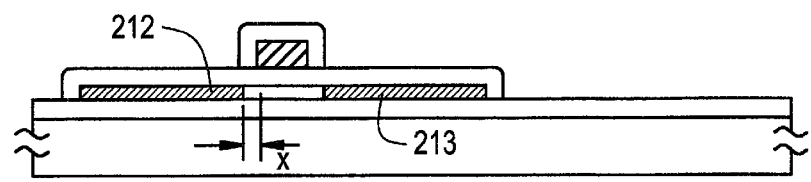
Figure 4F:
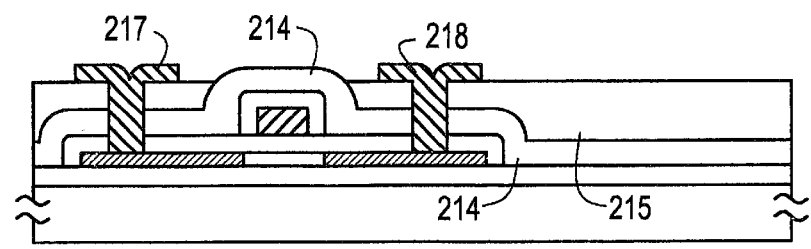

The silicon film 203 is crystallized thereafter under gaseous nitrogen in the temperature range of from 500 to 620° C., specifically, at 550° C., for 4 hours. The crystallization proceeds from the region 206, i.e., a contact portion between nickel and the silicon film, and in a direction in parallel with the substrate as indicated with an arrow. Referring to FIG. 4(A), nickel is directly introduced to crystallize a region 204, and the crystallization is found to occur in the lateral direction from the region to form a region 203. The crystallites grown along the transverse direction in the region 203 are about 25 μm in size. It is also confirmed that the crystallites in this region grow approximately along the <111> crystallographic axis (FIG. 4(A)).

The crystallinity of the silicon film 203 is improved further by irradiating an infrared (IR) rays upon the completion of the crystallization step above using heat treatment. Infrared rays at a wavelength of 1.2 μm is irradiated to obtain an effect equivalent to that obtained by treating the structure at a high temperature for several minutes.

A halogen lamp is used as the light source of the infrared ray. The intensity of the IR radiation is controlled as such that the temperature as measured on a single crystal silicon wafer provided as a temperature monitor be in a range of from 900 to 1,200° C. More specifically, the temperature as detected by a thermocouple buried in a silicon wafer is fed back to the light source emitting the infrared rays. In the present example, the temperature is raised at a rate in a range of from 50 to 200° C./sec, and is air cooled at a rate in a range of from 20 to 100° C. Because the silicon film can be selectively heated by the IR radiation, the thermal effect on the substrate can be minimized.

The film is then subjected to heat treatment in gaseous nitrogen at 550° C. for 4 hours to reduce the defects inside the film. The silicon oxide film 205 is removed thereafter. Simultaneously with the removal of the silicon oxide film 205, a thermal oxide film that is formed on the surface of the region 206 is also removed. An island-like active region 208 is formed by etching a patterned silicon film 204. Referring to FIG. 4(A), the region 206 corresponds to the region to which nickel is directly introduced in a high concentration. It is also confirmed that nickel is present in high concentration at the front edge of the crystal growth. These regions are found to contain nickel at higher concentrations as compared to the region located at the intermediate portion between the above regions. Accordingly in the present example, care is taken so that any region of high nickel concentration in the active layer 208 may not overlap the channel forming region.

An oxide film 209 is formed thereafter at a thickness of 1,000 Å by oxidizing the surface of the active layer (silicon film) 208. More specifically, the active layer is allowed to stand for an hour in an atmosphere containing 100% by volume of water vapor, while maintaining a temperature in a range of from 500 to 600° C., representatively at 550° C., and a pressure of 10 atm. By thus forming the silicon oxide film 209 by thermal oxidation, the substrate is maintained at 400° C. under 100% gaseous ammonia at 1 atm. Nitridation is effected to the resulting silicon oxide film 209 by irradiating thereto an infrared rays having a peak intensity in a wavelength range of from 0.6 to 4 μm, for instance, in a range of from 0.8 to 1.4 μm, for from 30 to 180 seconds. In the nitridation, from 0.1 to 10% of gaseous hydrogen chloride (HCl) can be added into the atmosphere (FIG. 4(B)).

An aluminum film containing from 0.01 to 0.2% by weight of scandium is deposited by sputtering to a thickness of from 3,000 to 8,000 Å, for example, to a thickness of 6,000 Å. The resulting aluminum film is patterned thereafter to form a gate electrode 210 (FIG. 4(C)).

The surface of the aluminum electrode is anodically oxidized thereafter to form an oxide layer 211 on the surface thereof. The anodic oxidation is effected in an ethylene glycol solution containing from 1 to 5% by weight of tartaric acid. The thickness of the resulting oxide layer 211 is 2,000 Å. Because the offset region that is formed in the later step of ion doping depends on the thickness of the oxide 211, the length of the offset region can be set in the anodic oxidation step above (FIG. 4(D)).

Then, an impurity, specifically phosphorus in this case, which renders the active layer region (which constitute source/drain and channel) N-type conductive, is added into the active layer region by ion doping (which is a synonym for plasma doping). The ion doping is effected in a self-aligned manner using the gate electrode portion, i.e., the gate electrode 210 and the oxidized layer 211 in the periphery thereof as the mask, while applying an accelerating voltage of from 60 to 90 kV, for example, at 80 kV, and using phosphine ($PH_3$) as the doping gas. Phosphorus is introduced at a dose of from $1\times10^{15}$ to $8\times10^{15}$ cm$^{-2}$, specifically, for example, at a dose of $4\times10^{15}$ cm$^{-2}$. N-type impurity regions 212 and 213 can be formed in this manner. It can be seen from the figure that the impurity region is formed offset from the gate electrode for a distance of x. Such an offset structure is effective, because the leak current (sometimes referred to as an "off current"), which is observed in case a reversed voltage (i.e., a negative value in case of an N-channel TFT) is applied to the gate electrode, can be effectively lowered. Particularly in a TFT for use in the control of a pixel electrode as in the present example, the leak current is preferably as low as possible. By lowering the leak current, the charge can be accumulated in the pixel electrode to reproduce favorable images.

Annealing is effected by irradiating a laser beam using a KrF excimer laser (operating at a wavelength of 248 nm and at a pulse width of 20 nsec). The laser is operated to provide from 2 to 10 shots per site, for example, 2 shots per site, at an energy density of from 200 to 400 mJ/cm$^2$, for instance, at 250 mJ/cm$^2$. Furthermore, a more effective annealing can be realized by heating the substrate in a range of from about 200 to 450° C. (FIG. 4(E)).

Then, a 6,000 Å thick silicon oxide film 214 is deposited as an interlayer dielectric by means of plasma CVD. Furthermore, a transparent polyimide film 215 is formed thereon by spin coating to obtain a planarized surface.

Contact holes are formed in the interlayer dielectric layers 214 and 215. Thus, electrode and interconnection 217 and 218 are formed by using a metallic material, for example, a multilayered film comprising titanium nitride and aluminum. Finally, a pixel circuit having a TFT for an active matrix device is obtained by annealing the resulting structure at 350° C. for 30 minutes under gaseous hydrogen at 1 atm. (FIG. 4(F))

Because the TFT fabricated according to the present example yields high mobility, it can be used as a driver circuit of an active-matrix addressed liquid crystal device.

EXAMPLE 5

Referring to FIGS. 5(A) to 5(D), a process for fabricating a semiconductor device according to the present example is described below. A silicon oxide film 302 is deposited by sputtering to a thickness of 2,000 Å as a base film 502 on a Corning 7059 glass substrate 501. The substrate is preferably subjected to annealing either before or after the deposition of the base film to suppress the shrinking which occurs in the later step which accompanies heating (inclusive of the thermal oxidation step of the present invention and the later step of thermal annealing). More specifically, the substrate is preferably annealed at a temperature higher than the deformation temperature, and then gradually cooled to a temperature not higher than the deformation temperature at a cooling rate of from 0.1 to 1.0° C./min. By minimizing shrinking in this manner, mask alignment can be facilitated in the later step. In case of a Corning glass substrate, it is annealed in a temperature range of from 620 to 660° C. for from 1 to 4 hours, and is gradually cooled at a rate of from 0.1 to 1.0° C./minute, preferably, at a rate of from 0.1 to 0.3° C./minute. The thus cooled substrate is taken out when the temperature reaches a temperature in a range of from 400 to 500° C.

An intrinsic (I-type) amorphous silicon film is deposited by means of plasma CVD at a thickness in a range of from 500 to 1,500 Å; for instance, at a thickness of 1,000 Å. Then, according to the method described in Example 1, nickel is introduced into the surface of the amorphous silicon film as a catalyst element which accelerates the crystallization. Thus, crystallization is effected by annealing at 550° C. for 4 hours under gaseous nitrogen. The crystallinity of the silicon film is improved by irradiating a laser beam using a KrF excimer laser. The resulting structure is annealed again at 550° C. for 4 hours under gaseous nitrogen. The silicon film is then patterned to provide an island-like silicon film (the active layer of the TFT) 503 having a square area of from 10 to 1,000 μm (FIG. 5(A)).

The surface of the active layer is oxidized by means of pyrogenic reaction for a thickness in a range of from 500 to 1,500 Å; representatively 1,000 Å in this case. More specifically, the process comprises allowing the active layer to stand still for from 3 to 5 hours in a temperature range of from 500 to 750° C., specifically in this case at 600° C., in gaseous oxygen at 1 atm and containing from 70 to 90% of water vapor, representatively, in mixed gas containing hydrogen and oxygen at a ratio of the former to the latter in a range of 1.5 to 1.9. Thus is obtained a silicon oxide film 504. It should be noted in the present process is that the initial silicon film loses its surface for a thickness of 50 Å or more. Thus, the contaminated outermost portions in the initial silicon film can be eliminated from the boundary between the silicon and the silicon oxide films. That is, a clean silicon-silicon oxide interface can be obtained. Because the thickness of the silicon oxide film amounts to twice the thickness of the silicon film to be oxidized, the thickness of the remaining silicon film can be calculated as 500 Å in case a 1,000 Å thick silicon film is oxidized to result in a 1,000 Å thick silicon oxide film.

In general, superior characteristics such as high mobility and low off current can be obtained with decreasing thickness of the silicon oxide layer (gate dielectric) and active layer. Considering the crystallization of the initial amorphous silicon film, on the other hand, the film can be crystallized more easily with increasing thickness thereof. It can be understood that conventional processes had to overcome these conflicting demands concerning the characteristics and the process. The present invention provides for the first time, a solution to the conflict. Thus, the process according to the present invention comprises forming a thick amorphous silicon film before performing the crystallization step to obtain a favorable crystalline film, and oxidizing the resulting silicon film to reduce the thickness thereof and thereby obtaining a thin film suitable for high quality TFTs. Furthermore, thermal oxidation has an effect of oxidizing the amorphous component containing recombination centers; i.e., as a result, the grain boundaries can be readily oxidized to reduce the concentration of the recombination centers in the active layer. Conclusively, the process according to the present invention enables products with high yield.

Figure 5A:
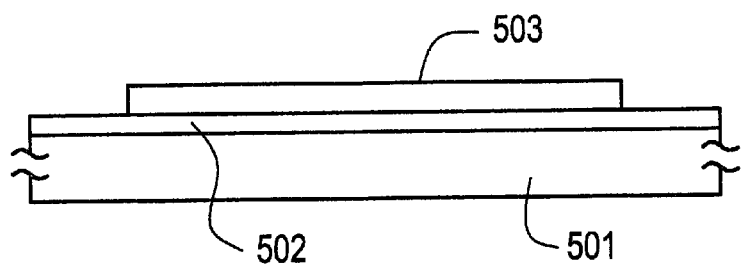
FIGS. 5(A) to 5(D) are diagrams showing the steps of the fabrication process according to another embodiment of the present invention.
Figure 5B:
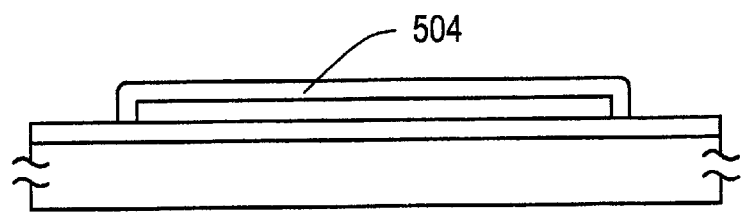
Figure 5C:
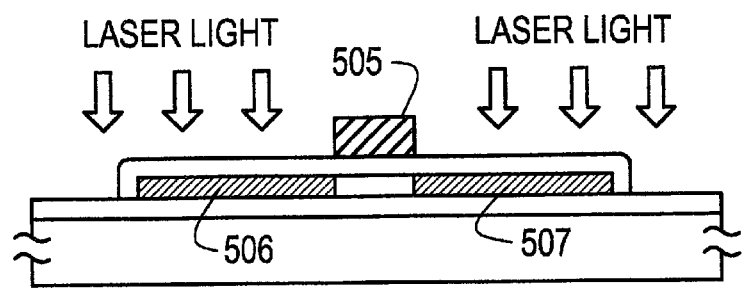
Figure 5D:
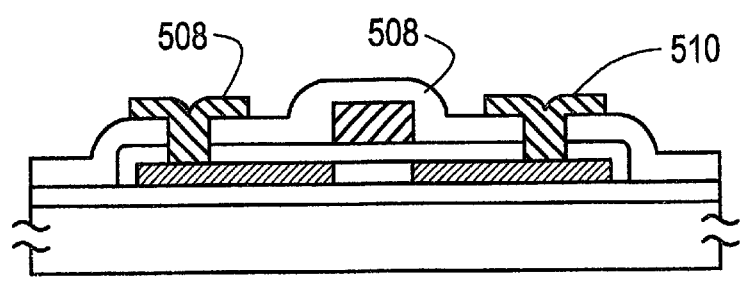

After forming a silicon oxide film 504 by thermal oxidation, the substrate is annealed at 600° C. for 2 hours under a 100% gaseous nitrous monoxide atmosphere (1 atm) (FIG. 5(B)).

Subsequently, a polycrystalline silicon film containing from 0.01 to 0.2% of phosphorus is deposited to a thickness in a range of from 3,000 to 8,000 Å by means of sputtering. More specifically, for instance, the silicon film is deposited to a thickness of 6,000 Å, and is patterned thereafter to provide a gate electrode 505. By using the silicon film as a mask, an impurity (phosphorus in this case) for imparting N-conductive characteristics to the active layer region (which constitute source/drain, and channels) is added in a self-aligned manner by means of ion doping (plasma doping). In the present example, phosphine ($PH_3$) is used as the doping gas to implant phosphorus. Thus, phosphorus is implanted by applying an accelerating voltage of from 60 to 90 kV, for example, 80 kV, and at a dose in a range of from $1 \times 10^{15}$ to $8 \times 10^{15}$ cm$^{-2}$. Thus are obtained the N-type impurity regions 506 and 507.

The ion-implanted impurities are activated thereafter by laser annealing. Annealing is performed by irradiating a laser beam using a KrF excimer laser operating at a wavelength of 248 nm and a pulse width of 20 nsec. The laser need not be a KrF excimer laser, and other types of lasers can be used as well. The laser is operated to provide from 2 to 10 shots per site, for example, 2 shots per site, at an energy density of from 200 to 400 mJ/cm$^2$, for instance, at 250 mJ/cm$^2$. Furthermore, a more effective annealing can be realized by heating the substrate in a range of from about 200 to 450° C. (FIG. 5(C)).

This step can be effected otherwise by lamp annealing using a near infrared ray. The near infrared ray can be more readily absorbed by a crystallized silicon than by an amorphous silicon. Thus, an effective annealing well comparable to a thermal annealing effected at 1,000° C. or higher can be realized. Because the near infrared ray is less adsorbed by a glass substrate (in contrast to a far infrared ray that is readily absorbed by a glass substrate, the visible and the near infrared region in the wavelength range of from 0.5 to 4 $\mu$m is hardly absorbed), and also because the process can be completed in a short period of time, lamp annealing using the near infrared ray is most suitable for a process in which shrinking of the glass substrate is found problematic.

Then, a 6,000 Å thick silicon oxide film 508 is deposited as an interlayer dielectric by means of plasma CVD. A polyimide film may be used otherwise as the interlayer dielectric. Contact holes are perforated thereafter to form electrode and interconnection 509 and 510 by using a metallic material, for example, a multilayered film comprising titanium nitride and aluminum. Finally, a TFT is obtained by annealing the resulting structure at 350° C. for 30 minutes under gaseous hydrogen at 1 atm (FIG. 5 (D)).

The TFT thus obtained according to the present example was found to have a mobility of from 110 to 150 cm$^2$/Vs and an S value in the range of from 0.2 to 0.5 V/digit. A P-channel TFT was fabricated in the same manner except for using boron as the dopant, and was found to have a mobility in the range of from 90 to 120 cm$^2$/Vs and an S value in the range of 0.4 to 0.6 V/digit. As compared with the cases in which the gate dielectric is formed by known PVD or CVD processes, the TFT according to the present invention was found to have a mobility of 20% or more higher, and an S value reduced by 20% or more of the conventional values.

From the viewpoint of reliability, the TFT fabricated according to the present invention exhibited favorable results well comparable to the TFTs fabricated by a high temperature thermal oxidation process.

EXAMPLE 6

FIGS. 6 (A) to 6 (F) show the cross sectional views for a process for fabricating a TFT according to an embodiment of the present invention, which is to be placed in the pixel portions of an active-matrix addressed liquid crystal device.

A 2,000 Å thick silicon oxide is deposited as a base film 52 on a Corning 7059 glass substrate 51 by sputtering. Then, an intrinsic (I-type) crystalline silicon film is formed thereon at a thickness of from 200 to 1,500 Å. More specifically, the I-type crystalline silicon film is formed at a thickness of 800 Å in this case. Then, a catalyst element, nickel, is introduced into the amorphous silicon film by means of the method described in Example 1, and is subjected to heat treatment at 550° C. for 4 hours in gaseous nitrogen to obtain a crystalline silicon film. By then irradiating a laser beam using a KrF excimer laser, the crystallinity of the thus obtained crystalline silicon film is further improved. Heat treatment at 550° C. for 4 hours in gaseous nitrogen is further performed on the resulting silicon film.

The crystalline silicon film thus obtained is free of distinct grain boundaries at particular regions. Thus, an active layer for a TFT can be formed in desired portions of the surface. That is, because the entire film is uniformly crystallized, the crystalline silicon film which constitutes the active layer of TFTs formed in a matrix can be provided with uniform characteristics over the TFTs. Accordingly, a plurality of TFTs with less fluctuation in characteristics can be obtained as a result.

An island-like region 53 of crystalline silicon is formed thereafter by patterning. A 1,000 Å thick silicon oxide film 54 is formed thereafter to cover the island-like crystalline silicon region 53. Although the description below refers to a single TFT in accordance with FIGS. 6 (A) to 6 (F), a plurality of TFTs which constitute a matrix are formed at the same time.

Subsequently, an aluminum film containing from 0.1 to 0.3% by weight of scandium is deposited by sputtering to a thickness of from 3,000 to 8,000 Å. More specifically in this case, the aluminum film containing scandium is deposited at a thickness of 6,000 Å. A thin anodic oxide from 100 to 400 Å in thickness is formed on the aluminum film thereafter. A photoresist is formed at a thickness of about 1 $\mu$m on the surface of the aluminum film by means of spin coating. Then, a gate electrode 55 is formed by a known process of photolithography. Thus, a mask 56 made of the photoresist is left over on the gate electrode (FIG. 6 (A)).

The substrate is then immersed into an aqueous 10% oxalic acid solution, and anodic oxidation is effected by applying a constant voltage in a range of from 5 to 50 V for from 10 to 500 minutes. More specifically, for instance, the anodic oxidation can be effected at a constant voltage of 8 V for 200 minutes. In this manner, a porous anodic oxide 57 is formed on the side of the gate electrode at a thickness of about 5,000 Å. Substantially no anodic oxidation is found to proceed on the upper side of the gate electrode because a mask material 56 is provided thereto (FIG. 6 (B)).

Then, the upper surface of the gate electrode is exposed by removing the mask material therefrom. The substrate is immersed into an ethylene glycol solution containing 3% of tartaric acid having its pH value controlled in the neutral region by using ammonia. Thus, anodic oxidation is effected by applying a current in such a manner that the voltage may be increased to 100 V at a rate of from 1 to 5 V/min, for example, at a rate of 4 V/min. Anodic oxidation is found to occur not only on the upper plane of the gate electrode, but also on the side planes of the gate electrode to form a dense anodic oxide 58 at a thickness of 1,000 Å. The withstand voltage of the anodic oxide was found to be 50 V or higher (FIG. 6 (C)).

The silicon oxide film 54 is etched thereafter by dry etching. The silicon oxide film alone is etched in this step without damaging the anodic oxide 57 and 58. After the etching, the silicon oxide film under the anodic oxide is found to be left over as a gate insulating film 59 (FIG. 6 (D)).

Then, the porous anodic oxide 57 is etched using a mixed acid of phosphoric acid, acetic acid, and nitric acid to expose the pore-free anodic oxide 58. Then, phosphorus is implanted as an impurity into the silicon region 53 by plasma doping using the gate electrode 55 and the porous anodic oxide 57 on the side plane as a mask. Thus, phosphorus is incorporated into the silicon region 53 at a dose of from $1\times10^{14}$ to $8\times10^{15}$ cm$^{-2}$ by applying an accelerating voltage in a range of from 5 to 30 kV using phosphine (PH$_3$) as the doping gas. More specifically in this case, phosphorus is incorporated into the silicon region 53 at a dose of $2\times10^{15}$ cm$^{-2}$ by applying an accelerating voltage of 10 kV.

Thus, the region 60 remaining uncovered by the gate insulating film 59 is implanted with phosphorus at a high concentration, however, the gate insulating film 59 functions as an obstacle in incorporating impurities into the region 61. Thus, the region 61 covered with the gate insulating film 59 remains lightly doped with phosphorus at a concentration corresponding to a range of from 0.1 to 5% of that of the region 60. An N-type heavily doped impurity region 60 and lightly doped impurity region 61 are established as a result (FIG. 6 (E)).

The impurity region thus fabricated by doping is activated by laser annealing which comprises irradiating a laser beam from the upper side of the structure. Then, a 6,000 Å thick silicon oxide film 62 is deposited as an interlayer dielectric by plasma CVD. An ITO electrode 64 is formed to provide a pixel electrode. Then, by using a metallic material such as a multilayered film of titanium nitride and aluminum, contact holes are provided in the silicon oxide film 62 to form an electrode with interconnection 63 for each of the source and drain regions of the TFT. Finally, the resulting structure is annealed in gaseous hydrogen at a pressure of 1 atm and at a temperature of 350° C. for 30 minutes. Thus is the structure completed into a thin film transistor (FIG. 6 (F)).

A lightly doped drain (LDD) structure is thus implemented in the present example. An LDD structure is known to be effective in suppressing the deterioration attributed to hot carriers. The same effect is observed in the TFT fabricated in the present example according to an embodiment of the present invention. The process according to the present example is still advantageous as compared with the known processes, however, in that an LDD is obtained by a single step of doping. Moreover, in the TFT according to the present example, a highly doped impurity region 60 is established by utilizing the gate insulating film 59 provided by the porous anodic oxide 57. This signifies that the impurity region in the present example is finally established indirectly by the porous anodic oxide 57. As shown in the foregoing, the width x of the LDD region is determined substantially by the width of the porous anodic oxide.

According to the process for fabricating a TFT as described in the present example, a still higher integrated structure can be implemented. In realizing a structure with a higher integration, the width x of the offset region or the LDD region is preferably varied according to the characteristics required for the TFT. Particularly, the constitution of the present invention realizes a low OFF current. Thus, the constitution according to the present invention is particularly suitable for use in a TFT designed for retaining carriers for pixel electrodes.

EXAMPLE 7

Figure 7:
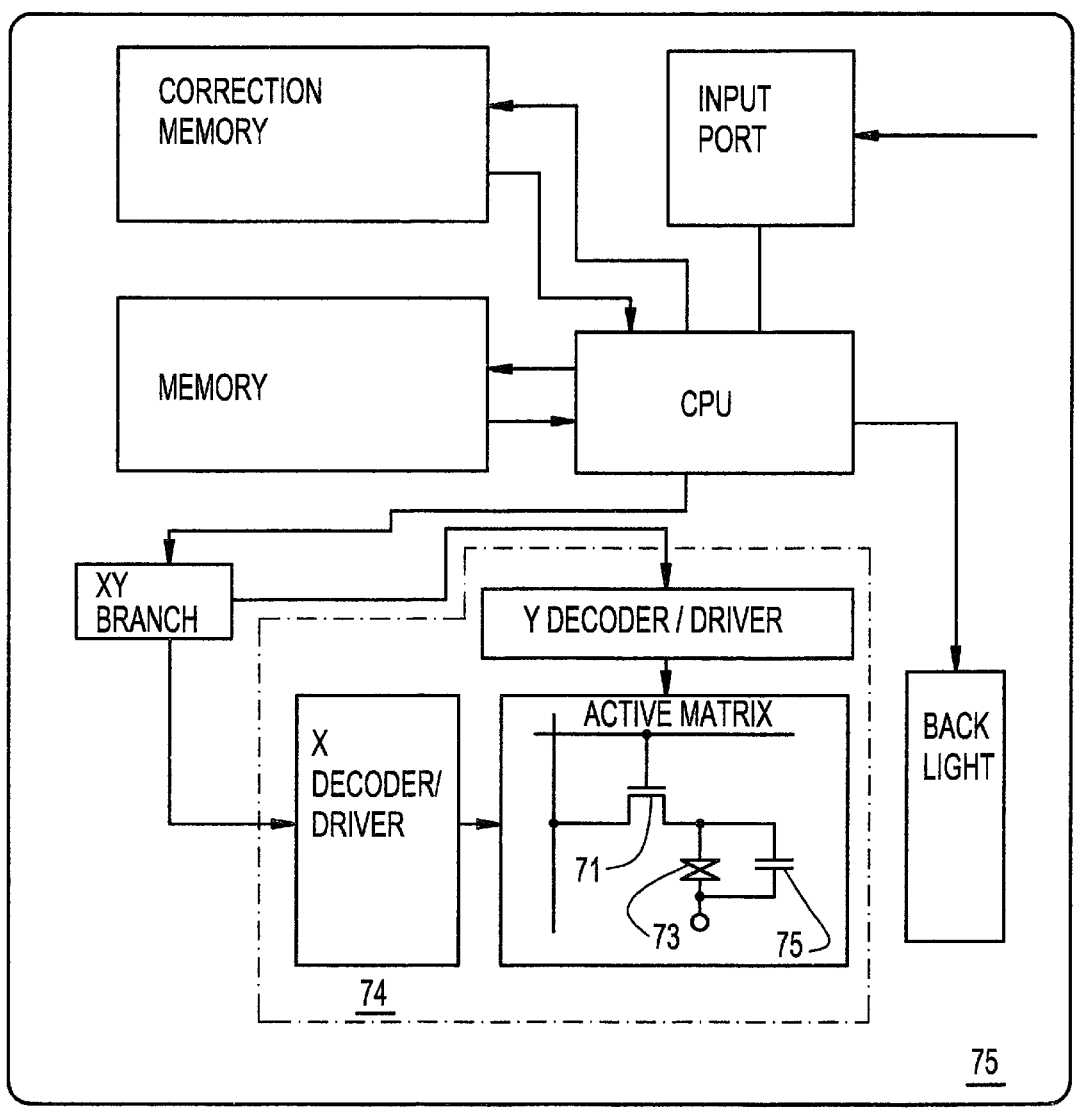
FIG. 7 is a diagram showing the constitution of an embodiment of the present invention.
Figure 9A:
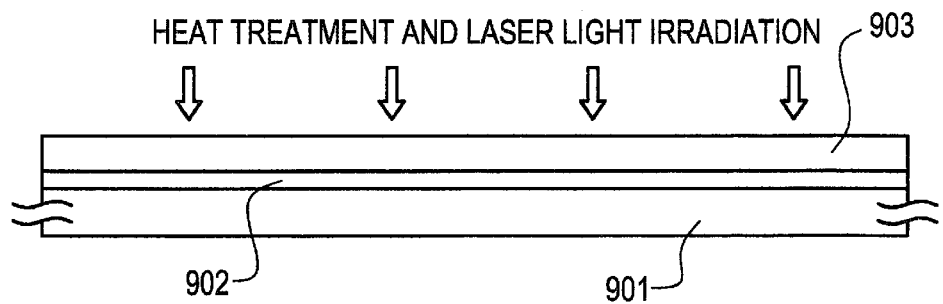
FIGS. 9(A) to 9(D) are diagrams showing the steps of the fabrication process according to another embodiment of the present invention.
Figure 9B:
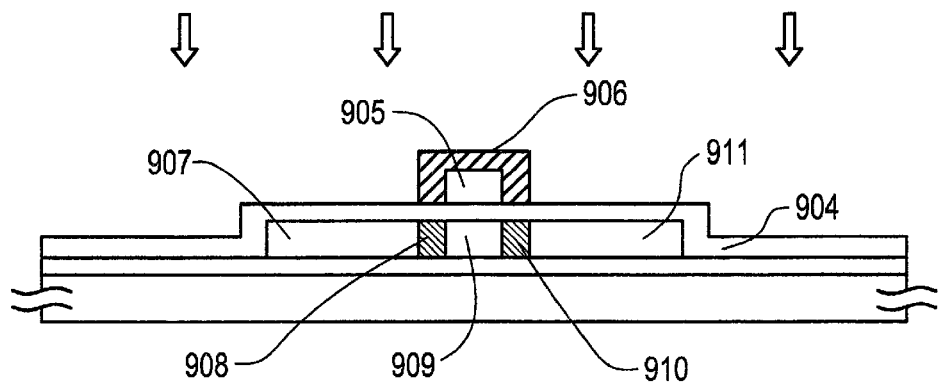
Figure 9C:
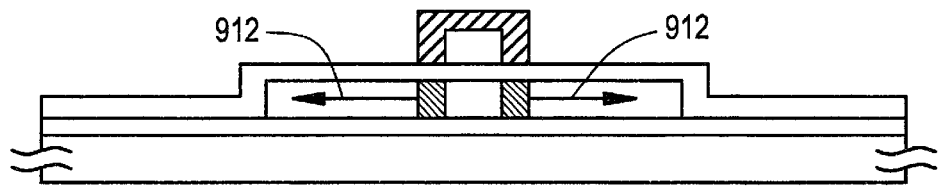
Figure 9D:
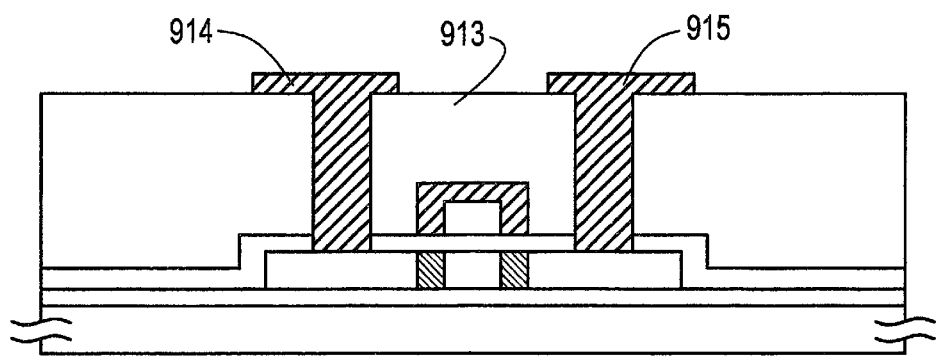

Referring to a block diagram in FIG. 7, an electro-optical system is described below. The system comprises an integrated circuit having a display element, a CPU (central processing unit), and memories packaged on a single glass substrate. In the system, an input port reads a signal input from the outside and converts it into an image signal, whereas a correction memory is provided as an inherent memory for the panel to correct the input signal and the like in accordance with the characteristics of the active matrix panel. In particular, the correction memory stores the information inherent to each of the pixels in a non-volatile memory to correct the signal independently for each of the pixels. More specifically, in case a point defect is found in a pixel of the electro-optical device, correction signals are sent to the pixels around the defective pixel to compensate for the defect. In case a pixel is found to be darker than the surrounding pixels, a more intense signal is sent to the pixel under consideration to make the pixels yield a uniform brightness.

The CPU and the memories mounted in the system are the same as those used in an ordinary computer. In particular, the memory holds image memory corresponding to each of the pixels as a RAM (random access memory). Furthermore, the intensity of the backlight for lighting the substrate from the back can be varied according to the image information.

An offset region or an LDD region can be provided with an optimal width according to each of the circuits by individually setting the condition of anodic oxidation. This can be realized by establishing separately from 3 to 10 interconnecting lines. Typically in an active matrix circuit, a channel is set at a length of 10 μm and an LDD region at a width in a range of from 0.4 to 1 μm, specifically 0.6 μm. An N-channel TFT driver typically comprises a channel having a length of 8 μm and a width of 200 μm, and an LDD region having a width of from 0.2 to 0.3 μm, for example, 0.25 μm. A typical P-channel TFT driver comprises a channel having a length of 5 μm and a width of 500 μm, and an LDD region having a width of from 0 to 0.2 μm, for example, 0.1 μm. In case of a decoder, an N-channel TFT is typically provided with a channel having a length of 8 μm and a width of 10 μm, and an LDD region having a width of from 0.3 to 0.4 μm, for example, 0.35 μm, whereas a P-channel TFT is provided with a channel having a length of 5 μm and a width of 10 μm, and an LDD region having a width of from 0 to 0.2 μm, for example, 0.1 μm. Referring to FIG. 7, the width of the LDD region for the N-channel and P-channel TFTs of the CPU, input port, correction memory, and the memory is set optimally in the same manner as in a high-frequency low-power decoder. Thus is obtained an electro-optical device 74 on a single substrate having an insulating surface.

In the present invention, the width of the high resistance region is set variable in two to four types, or even more, according to the use. Furthermore, the high resistance region in the device according to the present invention need not be made from the same material nor be of the same conductive type as that of the channel region. More specifically, a trace amount of an N-type impurity may be added in case of an N-channel TFT, or a trace amount of a P-type impurity may be added in a P-channel TFT. Otherwise, carbon, oxygen, nitrogen, and the like can be incorporated selectively to form a high resistance region. At any rate, these means are effective for improving the reliability, frequency characteristics, and off-current properties that are trade-offs for the degradation attributed to the generation of hot carriers.

For the TFTs of driver circuits provided to pixel electrodes, it is particularly preferred to use the TFTs described above with reference to FIGS. 3 (A) to 3 (E), 4 (A) to 4 (F), and 5 (A) to 5 (D).

EXAMPLE 8

The present example is characterized in that it comprises a fabrication process comprising:

(1) crystallizing an amorphous silicon film by heat treatment using nickel;
(2) irradiating a laser beam to the silicon film obtained in (1) to further improve the crystallinity thereof;
(3) forming source/drain region by first forming a gate electrode and then implanting impurities using the gate electrode as a mask; and
(4) performing heat treatment, thereby recrystallizing the source/drain regions and activating the implanted impurities.

As briefly shown above, the present example is characterized in that the steps of heat treatment, irradiation of laser beam, and heat treatment are carried out sequentially in this order. The first heat treatment is provided to crystallize the amorphous silicon film; the laser beam enhances the crystallization of the amorphous silicon film; and the second heat treatment recrystallizes the source/drain regions, activates the impurities incorporated into the regions, and removes defects from the channel region.

Referring to FIGS. 9 (A) to 8 (D), a process for fabricating a thin film transistor is described below. A 2,000 Å thick silicon oxide film 902 is deposited on glass substrate 901 by sputtering. Then, after depositing a 1,000 Å thick amorphous silicon film by plasma CVD or a reduced pressure thermal CVD, nickel is introduced into the surface of the amorphous silicon film by using nickel acetate. Subsequently, the amorphous silicon film is crystallized by heating it at 550° C. for 4 hours. Thus is obtained a crystalline silicon film 903.

Upon completion of the heat treatment, the crystallinity of the resulting crystalline silicon film 903 is improved by irradiating laser beam using a XeCl excimer laser operated at a wavelength of 308 nm and a XeF excimer laser operated at an irradiation intensity of 300 mJ/cm² (FIG. 9 (A)).

The crystalline silicon film 903 is then patterned to form an active layer of a TFT. A silicon oxide film is deposited to have a thickness of 1,000 Å to provide a gate dielectric. After forming the gate dielectric, a film containing aluminum as the principal component is formed at a thickness of 5,000 Å, and patterned to provide a gate electrode 905. An oxide layer 905 is formed at a thickness of 2,000 Å on the periphery of the gate electrode 905 by performing anodic oxidation in an electrolytic solution during the gate electrode as the anode.

Impurity ions are implanted by using the gate electrode 905 and the surrounding oxide layer 906 as masks to form a source region 907, a drain region 911, a channel region 909, and offset gate regions 908 and 910 in a self-aligned manner. To obtain an N-channel TFT, phosphorus ions are used as the impurity ions. At this step, the source/drain regions become amorphous due to the impact of the bombarded ions (FIG. 9 (B)).

Referring to FIG. 9 (C), heat treatment is effected at 500° C. for 2 hours to recrystallize the source region 907 and the drain region 911, and to activate the implanted phosphorus ions. In this step, crystal growth takes place during the heat treatment in such a manner that the crystals grow from the boundary between the crystalline offset gate region 908 and the amorphous source region 907 in a direction indicated with an arrow 912. The crystal growth proceeds from the offset region 908 provided as nuclei. Similarly, crystals grow also from the boundary between the crystalline offset gate region 910 and the amorphous drain region 911 in a direction indicated with an arrow 912. The crystal growth proceeds easily at a temperature of 500° C. or lower by the function of the phosphorus ions implanted into the source/drain regions. Furthermore, because a continuous crystal structure can be obtained from the offset gate region, the concentration of defects attributed to the lattice mismatch can be prevented from occurring.

The heat treatment step with reference to FIG. 9 (C) can be performed at a temperature not lower than 300° C. Considering that aluminum is used for the gate electrode, and that a glass substrate has insufficient heat resistance, the heat treatment in this case is performed in a temperature range of from 300 to 600° C.

Referring also to FIG. 9 (C), it is effective to combine annealing using a laser beam or an intense light with the heat treatment step either before or after the heat treatment.

After forming an interlayer dielectric at a thickness of 6,000 Å by means of plasma CVD, a source electrode 914 and a drain electrode 915 are formed. A complete thin film transistor as illustrated in FIG. 9 (D) can be obtained by further applying heat treatment in gaseous hydrogen at a temperature of 350° C. for hydrogenation.

The present invention describes a constitution in which offset gate regions 908 and 910 are formed. However, in case no offset gate regions are formed, the crystallization proceeds from the crystalline channel region to the source/drain region in the heating step with reference to FIG. 9 (C).

By thus using a crystalline silicon film obtained by crystallizing at a low temperature and in a short period of time by incorporating a catalyst element, followed by irradiation of a laser beam or an intense light and by a further heat treatment, a semiconductor device having excellent characteristics can be fabricated with high productivity.

In particular, by using an intrusive type catalyst element represented by nickel, the following effects can be obtained:

(1) crystalline silicon film having a uniform crystallinity and free of grain boundaries concentrated to a particular region can be obtained. By utilizing the crystalline silicon film, a plurality of thin film transistors having uniform characteristics can be formed on a single plane; this is particularly advantageous in fabricating, for example, an active matrix addressed liquid crystal display device; and
(2) A crystalline silicon film composed of crystals whose direction of growth is controlled can be obtained. This enables a thin film transistor of desired characteristics.

Some methods are available to solidify and crystallize an amorphous silicon film, using a metal catalyst for promoting crystallization.

One of these methods is a method of "physical formation". That is, a film of a metal catalyst such as Ni, Fe, Ru, Rh, Pd, Os, Ir, Pt, Cu, or Au is formed by sputtering, electron-beam evaporation, or other process. Where this method is employed, even if the average thickness of the metal film is 5 to 200 Å, e.g., 10 to 50 Å, the catalyst is easily formed into islands on the desired surface.

More specifically, the metal catalyst forms fine grains having an average diameter of 50 to 200 Å. The formed fine grains are often sporadically distributed. The grains are spaced about 100 to 1000 Å from each other. In other words, a discontinuous layer, or a nonuniform layer, is formed. It is very difficult to form a continuous, uniform layer. These metal islands form crystallization nuclei. A crystal of an amorphous silicon film is grown on an insulating substrate by thermal treatment conducted at 450 to 600° C.

This technique for the physical formation can lower the crystallization temperature by 50 to 100° C. compared with the crystallization temperature used in a process carried out without using such a catalyst. However, careful observation of the crystallized film reveals that a very large number of amorphous components are left and that they are metal regions exhibiting metallic properties. We estimate that the metal nuclei are left as they are.

These metal regions act as recombination centers for electrons and positive holes in the crystallized semiconductor region. When a reverse bias voltage is applied to a semiconductor device, especially a semiconductor device having a PI or NI junction, the metal regions almost always existing in the semiconductor device region increase the leakage current. In this way, the metal regions adversely affect the characteristics severely.

For example, where a thin-film transistor having a channel length of 8 $\mu$m and a channel width of 8 $\mu$m is constructed, the OFF current should be on the order of $10^{-12}$ A. In practice, however, the measured OFF current is $10^{-10}$ to $10^{-6}$ A, which is $10^2$ to $10^6$ times as large as the former value.

In order to remove these drawbacks, the present invention provides a method of chemical formation as a method of forming a film of a metal catalyst. In this method, a metallic compound diluted with a solution (e.g., water or isopropyl alcohol) to a concentration of 1 to 1000 ppm, typically 10 to 100 ppm, is used. Especially, an organometallic compound is employed. Examples of the metallic compound used for the method of chemical formation are described below.

(1) Where Ni is used as a catalytic element

As a nickel compound, at least one selected from the group consisting of nickel bromide, nickel acetate, nickel oxalate, nickel carbonate, nickel chloride, nickel iodide, nickel nitrate, nickel sulfate, nickel formate, nickel oxide, nickel hydroxide, nickel acetylacetonate, 4-cyclohexyl nickel butyrate, and 2-ethyl hexanoic nickel can be used.

As a solvent containing Ni, at least one unpolar solvent selected from the group consisting of benzene, toluene-xylene, carbon tetrachloride, chloroform, ether, trichloroethylene, and Freon can be used.

(2) Where Fe (iron) is used as a catalytic element

As a ferric or ferrous material, one selected from the group consisting of ferrous bromide ($FeBr_2 6H_2O$), ferric bromide ($FeBr_3 6H_2O$), ferric acetate ($Fe(C_2H_3O_2)_3 xH_2O$), ferric chloride ($FeCl_2 4H_2O$), ferric chloride ($FeCl_3 6H_2O$), ferric fluoride ($FeF_3 3H_2O$), ferric nitrate ($Fe(NO_3)_3 9H_2O$), ferrous phosphate ($Fe_3(PO_4)_2 8H_2O$), and ferric phosphate ($FePO_4 2H_2O$) can be used.

(3) Where Co (cobalt) is used as a catalytic element

As a cobalt compound, one selected from the group consisting of cobalt bromide ($CoBr 6H_2O$), cobalt acetate ($Co(C_2H_3O_2)_2 4H_2O$), cobalt chloride ($CoCl_2 6H_2O$), cobalt fluoride ($CoF_2 xH_2O$), and cobalt nitrate ($Co(No_3)_2 6H_2O$) can be used.

(4) Where Ru (ruthenium) is used as a catalytic element

As a compound of ruthenium, a material known as a ruthenium salt such as ruthenium chloride ($RuCl_3 H_2O$) can be used.

(5) Where Rh (rhodium) is used as a catalytic element

As a compound of rhodium, a material known as a rhodium salt such as rhodium chloride ($RhCl_3 3H_2O$) can be used.

(6) Where Pd (palladium) is used as a catalytic element

As a compound of palladium, a material known as a palladium salt such as palladium chloride ($PdCl_2 2H_2O$) can be used.

(7) Where Os (osmium) is used as a catalytic element

As a compound of osmium, a material known as an osmic or osmious material such as osmium chloride ($OsCl_3$) can be used.

(8) Where Ir (iridium) is used as a catalytic element

As a compound of iridium, a material known as an iridium salt such as iridium trichloride ($IrCl_3 3H_2O$) or iridium tetrachloride ($IrCl_4$) can be used.

(9) Where Pt (platinum) is used as a catalytic element

As a compound of platinum, a material known as a platinum salt such as platinic chloride ($PtCl_4 5H_2O$) can be used.

(10) Where Cu (copper) is used as a catalytic element

As a compound of copper, a material selected from the group consisting of cupric acetate ($Cu(CH_3COO)_2$), cupric chloride ($CuCl_2 2H_2O$), and cupric nitrate ($Cu(NO_3)_2 3H_2O$) can be used.

(11) Where gold is used as a catalytic element

As an auric compound, a material selected from the group consisting of gold trichloride ($AuCl_3 xH_2O$); aurichloride ($AuHCl_4 4H_2O$), and gold sodium tetrachloride ($AuNaCl_4 2H_2O$) can be used.

These can be sufficiently separated into single molecules and dispersed in a solution. If this solution is dripped onto a desired surface to which a catalyst is added, the surface is rotated at a speed of 50 to 500 rpm. Under this condition, the solution is spin-coated. In this way, the solution can be spread over the whole surface.

These methods are desirable in that a metal catalyst can be dispersed as individual atoms in a semiconductor film through an oxide film. These methods are especially desirable because the catalyst can be dispersed and crystallization can be accomplished without intentionally creating crystal nucleic or grains.

Another method can also be utilized. In particular, an organometallic compound is uniformly coated on a desired surface. The formed coating is processed with ozone, i.e., processed with UV within oxygen, to form a metal oxide film. This metal oxide film is used as a starting material for crystallization. In this method, the organic material is oxidized. Then, the material can be driven off as carbon dioxide gas. Hence, more uniform solid-phase epitaxial growth can be achieved.

If the spin coating is effected only at a low speed, the metal component in the solution which exists on the surface is supplied onto the semiconductor film. The amount of the supplied component often exceeds the amount which is necessary for solid-phase epitaxial growth. Therefore, after the low-speed rotation, the laminate is rotated at a sped of 1,000 to 10,000 rpm, typically 2,000 to 5,000 rpm. Thus, the excessive organic metal can be fully swept out the laminate surface. Furthermore, the surface can be sufficiently dried. In addition, this method is effective in quantifying the organic metal existing on the surface.

This method of chemical formation makes it possible to form a uniform and continuous layer on the semiconductor surface without creating nuclei out of metal particles used for crystallization. The method of physical formation results in an unhomogeneous layer but the novel method of chemical formation produces a homogenous layer.

If this technical concept is exploited, when a thermal crystallization process is carried out at 450 to 650° C., a crystal can be quite uniformly grown over the whole surface.

If a reverse bias voltage is applied to a semiconductor having a PI or NI junction and a semiconductor film formed by crystallization making use of the chemical formation method described above, the leakage current can be almost successfully suppressed within a level of $10^{-12}$ A.

In the case of the method of physical formation, 90 to 100 PI junctions, for example, out of 100 PI junctions produce large leakage currents of $10^{-10}$ to $10^{-5}$ A. Fifty no 70 NI junctions out of 100 NI junctions yield large leakage currents of $10^{-12}$ to $10^{-6}$ A.

In the case of the method of chemical formation, the leakage currents from 5 to 20 PI junctions out of 100 PI junctions can be suppressed within $10^{-13}$ to $10^{-8}$ A. The leakage currents from 0 to 2 NI junctions out of 100 NI junctions can be suppressed within $10^{-13}$ to $10^{-8}$ A. In this way, the OFF currents can be lowered. Films producing large leakage currents can be reduced in number. The characteristics can be improved greatly.

Where such a semiconductor film is formed on an insulating film and TFTs are formed, great advantages can be obtained, whether the TFTs are of the P-channel type (PIP) or N-channel type (NIN). Furthermore, the probability of existence of TFTs producing large leakage currents can be reduced by about one or two orders of magnitude compared with TFTs formed by the physical formation method. However, if a thin-film integrated circuit is built, using these TFTs, then the probability of existence of TFTs producing large leakage currents is required to be reduced further by 3 to 9 orders of magnitude.

After thermal crystallization is effected by the above-described chemical formation method with addition of a catalytic metal, if the surface is irradiated with laser light having a wavelength of 248 nm or 308 nm with an intensity of 250 to 400 mJ/cm$^2$, then regions heavily doped with the metal component absorb the laser light more strongly than crystallized silicon films, because metallic regions left as amorphous regions are optically black. On the other hand, crystal components are transparent.

Therefore, the slightly remaining amorphous component is selectively melted by laser irradiation. In this way, the metal component can be dispersed and recrystallized. The metal existing in the regions can be divided into individual atoms and dispersed.

In the finished film, the probability of existence of the metal regions can be reduced further. The metal regions form recombination centers for electrons and holes, thus preventing the leakage current from increasing. Consequently, the OFF currents of the NI junctions of the TFTs and the OFF currents of the PI junctions are reduced down to $10^{-13}$ to $10^{-12}$ A, i.e., reduced by about one to two orders of magnitude. Furthermore, out of $10^4$ to $10^8$ TFTs, the number of the TFTs producing large leakage currents can be suppressed to 1–3.

In this manner, the reverse leakage current $I_{off}$ is reduced by two orders of magnitude. The probability of existence of TFTs producing large leakage currents can be reduced by two orders of magnitude at best. We estimate that the great leakage currents still produced from the TFTs is due to dust adhering to the semiconductor surface; organic metal atoms are concentrated in the dust. We have successfully confirmed that the characteristics are improved owing to improved performance of the experimental apparatus.

We attempted experiments, using the method of physical formation. In these experiments, thermally crystallized samples were irradiated with laser light. When the semiconductor was melted by laser irradiation and recrystallized, the OFF currents of the PI and NI junctions produced when a reverse bias voltage was applied could not be reduced at all because metal grains in the starting film were too great.

In this way, semiconductor devices fabricated by the novel method of chemical formation is entirely different from semiconductor devices fabricated by the method of physical formation. This physical formation method consists of formation of a discontinuous layer of a metallic catalyst and subsequent thermal crystallization. The chemical formation method consists of formation of a continuous layer of a metal catalyst, especially of an organometallic catalyst, and subsequent thermal crystallization. The chemical method of formation is a quite excellent technique.

One available chemical method consists of depositing a metal compound, especially an organometallic compound, on a desired surface out of gas of the compound instead of liquid by CVD. This method is quite effective in reducing the OFF currents of the TFTs and reducing the probability of existence of TFTs producing large leakage currents, in the same way as in the case using liquid.

The physical formation method can be referred to as a nonuniform anisotropic crystal growth method using metal nuclei. On the other hand, the chemical formation method can be referred to as uniform isotropic crystal growth using a uniform metal catalyst.

In this chemical method, crystals can be grown laterally of the substrate surface. Also, crystals can be grown vertically to the substrate surface either upwardly or downwardly of the semiconductor. In this way, good electrical characteristics can be obtained from the semiconductor.

The present invention is characterized in that a catalytic element is introduced tangential to the surface of an amorphous silicon film. This is quite important when the amount of the catalytic element is controlled.

While the invention has been described in detail and with reference to specific embodiments thereof, it will be apparent to one skilled in the art that various changes and modifications can be made therein without departing from the spirit and scope thereof.

What is claimed is:

1. A method for manufacturing a semiconductor device comprising the steps of:

forming a semiconductor film comprising amorphous silicon on an insulating surface by CVD;

crystallizing said semiconductor film by heating;

annealing said semiconductor film in an oxidizing gas containing atmosphere;

performing a rapid thermal annealing on the crystallized semiconductor film;

heating the semiconductor film at 400° C. or higher to reduce a spin density of said semiconductor film.

2. A method according to claim 1, wherein said CVD is selected from PCVD and LPCVD.

3. A method according to claim 1, wherein said CVD is LPCVD.

4. A method according to claim 1, wherein said semiconductor film is at a thickness of from 500 to 1500 Å.

5. A method according to claim 1, wherein said oxidizing gas is selected from oxygen and ozone.

6. A method according to claim 1, wherein said heating step after said irradiating step is carried out in a nitrogen containing atmosphere.

7. A method for manufacturing a semiconductor device comprising the steps of:

forming a semiconductor film comprising amorphous silicon on an insulating surface by CVD:
crystallizing said semiconductor film by heating;
forming a silicon oxide film on said semiconductor film;
treating said semiconductive film with a rapid thermal annealing; and then
heating the semiconductor film at 400° C. or higher to reduce a spin density of said semiconductor film.

8. A method according to claim 7, wherein said CVD is selected from PCVD and LPCVD.

9. A method according to claim 7, wherein said CVD is LPCVD.

10. A method according to claim 7, wherein said semiconductor film is at a thickness of from 100 to 1500 Å.

11. A method according to claim 7, wherein said heating step after said treating step is carried out in a nitrogen containing atmosphere.

12. A method for manufacturing a semiconductor device comprising the steps of:
forming a semiconductor film comprising amorphous silicon on an insulating surface by CVD;
crystallizing said semiconductor film by heating;
performing rapid thermal annealing on the crystallized semiconductor film;
heating the semiconductor film at 400° C. or higher to reduce a spin density of said semiconductor film; and then
said method further comprising a step of oxidizing a surface of said semiconductor film after the crystallization thereof.

13. A method according to claim 12, wherein said CVD is selected from PCVD and LPCVD.

14. A method according to claim 12, wherein said CVD is LPCVD.

15. A method according to claim 12, wherein said semiconductor film is at a thickness of from 500 to 1500 Å.

16. A method according to claim 12, wherein said heating step after said irradiating step is carried out in a nitrogen containing atmosphere.

17. A method for manufacturing a semiconductor device comprising the steps of:
heat treating an amorphous semiconductor film in a nitrogen containing atmosphere to crystallize the amorphous semiconductor film;
irradiating infrared light to further improve the crystallinity;
heat treating the irradiated semiconductor film to reduce a number of spin density in the crystallized semiconductor film in a nitrogen containing atmosphere; and then,
heat treating the semiconductor film in a hydrogen containing atmosphere to effect hydrogenation of the semiconductor film.

18. A method according to claim 17, wherein said amorphous semiconductor film is formed by LPCVD.

19. A method for fabricating a semiconductor device comprising the steps of:
thermally crystallizing an amorphous semiconductor film;
irradiating infrared light to crystallize the semiconductor film after said thermally crystallizing step;
annealing the semiconductor film by thermal treatment after said crystallizing step to reduce the number of spin density in the semiconductor film; and then,
annealing the semiconductor film in a hydrogen containing atmosphere to effect hydrogenation of the semiconductor film.

20. A method according to claim 19, wherein said amorphous semiconductor film is formed by LPCVD.

21. A method for fabricating a semiconductor device comprising the steps of:
heat treating an amorphous semiconductor film to crystallize an amorphous semiconductor film;
irradiating infrared light to the crystalline semiconductor film to further improve the crystallinity;
heat treating the irradiated semiconductor film to reduce the number of dangling bonds in the crystallized semiconductor film; and then,
heat treating the semiconductor film in a hydrogen containing atmosphere to effect hydrogenation of the semiconductor film.

22. A method according to claim 21, wherein said amorphous semiconductor film is formed by LPCVD.

23. A method for fabricating a semiconductor device comprising the steps of:
thermally crystallizing an amorphous semiconductor film;
irradiating infrared light to crystallize the semiconductor film after said thermally crystallizing step;
annealing the semiconductor film by thermal treatment after said crystallizing step to reduce the number of dangling bonds in the semiconductor film; and then,
annealing the semiconductor film in a hydrogen containing atmosphere to effect hydrogenation of the semiconductor film.

24. A method according to claim 23, wherein said amorphous semiconductor film is formed by LPCVD.

* * * * *